(12) United States Patent
Kanagaraj et al.

(10) Patent No.: US 12,088,773 B1
(45) Date of Patent: Sep. 10, 2024

(54) CAMERA APPARATUS AND METHOD OF AUGMENTING AGRICULTURAL IMAGE DATA FOR ENHANCED ERROR HANDLING

(71) Applicant: Tartan Aerial Sense Tech Private Limited, Bangalore (IN)

(72) Inventors: Dhivakar Kanagaraj, Karur (IN); Pranav M P, Bengaluru (IN); Raghul Raghu, Madurai (IN); Parth Gupta, New Delhi (IN); Ananya Mahapatra, Rajasthan (IN)

(73) Assignee: Tartan Aerial Sense Tech Private Limited, Bangalore (IN)

( * ) Notice: Subject to any disclaimer, the term of this patent is extended or adjusted under 35 U.S.C. 154(b) by 0 days.

(21) Appl. No.: 18/444,378

(22) Filed: Feb. 16, 2024

(30) Foreign Application Priority Data

Oct. 19, 2023 (IN) .............................. 202341071593

(51) Int. Cl.
| | |
|---|---|
| *G06K 9/36* | (2006.01) |
| *G06T 11/60* | (2006.01) |
| *G06V 10/25* | (2022.01) |
| *G06V 10/56* | (2022.01) |
| *G06V 20/10* | (2022.01) |
| *H04N 1/60* | (2006.01) |

(52) U.S. Cl.
CPC ........... *H04N 1/6002* (2013.01); *G06T 11/60* (2013.01); *G06V 10/25* (2022.01); *G06V 10/56* (2022.01); *G06V 20/188* (2022.01)

(58) Field of Classification Search
CPC . G06T 11/60; G06T 7/11; G06T 7/136; G06T 2207/10024; G06T 2207/20081; G06T 2207/20084; G06T 2207/30188; G06V 10/25; G06V 10/56; G06V 20/188; G06V 20/20; G06V 10/273; G06V 10/7715; G06V 10/7747; G06V 10/82; G01N 20/68; G01N 2021/8466; G01N 2021/8472
See application file for complete search history.

(56) References Cited

U.S. PATENT DOCUMENTS

| | | | |
|---|---|---|---|
| 2019/0220666 A1* | 7/2019 | Kiepe | ................... G06V 10/764 |
| 2021/0397888 A1* | 12/2021 | Kuramoto | .............. G06Q 50/02 |

FOREIGN PATENT DOCUMENTS

WO WO-2023242793 A1 * 12/2023 ............. A01B 39/18

* cited by examiner

*Primary Examiner* — Duy M Dang
(74) *Attorney, Agent, or Firm* — Barta Jones, PLLC

(57) ABSTRACT

A camera apparatus includes control circuitry configured to acquire an input color image of an agricultural field, detect one or more foliage regions, and generate output binary mask images of foliage mask indicating one or more foliage regions and a soil region. The control circuitry is configured to convert the input color image to a Hue, Saturation, Lightness (HSV) color space to obtain an HSV image. Thereafter, the control circuitry is configured to selectively adjust a hue component and convert back to the RGB color space to obtain a soil region-adjusted RGB image. Furthermore, generate an augmented color image by combining pixels of the soil region, with pixels of the one or more foliage regions and utilize the generated augmented color image in training of a crop detection (CD) neural network model to learn a plurality of different types of soil and a range of color variation of soil.

20 Claims, 17 Drawing Sheets

CAMERA APPARATUS AND METHOD OF AUGMENTING AGRICULTURAL IMAGE DATA FOR ENHANCED ERROR HANDLING

CROSS-REFERENCE TO RELATED APPLICATIONS/INCORPORATION BY REFERENCE

This Patent Application makes reference to, claims the benefit of, and claims priority to an Indian Provisional Patent Application No. 202341071593, filed on Oct. 19, 2023, which is incorporated herein by reference in its entirely, and for which priority is hereby claimed under the Paris Convention and 35 U.S.C. 119 and all other applicable law.

The application further makes reference to U.S. application Ser. No. 18/401,066 filed on Dec. 29, 2023.

The above referenced applications are hereby incorporated herein by reference in their entirety.

FIELD OF TECHNOLOGY

Certain embodiments of the disclosure relate to camera-based agricultural machines and systems. More specifically, certain embodiments of the disclosure relate to a camera apparatus for an agricultural machine and a method of augmenting agricultural image data for enhanced error handling.

BACKGROUND

With the rapid advancement of machines, agricultural implements, special-purpose vehicles, and vehicle-mounted apparatus, productivity in agricultural operations has increased. Modern agronomy makes use of the best technological devices and techniques to increase the yield. Foliage detection and/or crop detection using camera plays a crucial role in camera-driven agricultural solutions due to its significant impact on farm upkeep and automation.

In certain scenarios, neural network models may be trained for the purpose of foliage detection or crop detection. Typically, these neural networks are heavily reliant on a lot of training data to avoid overfitting and poor model performance. Unfortunately, in many cases such as real-world agricultural applications, there is limited data available, and gathering enough training data is very challenging and expensive. One of the most difficult challenges is the generalizability of deep learning models that describes the performance difference of a model when evaluated on previously seen data (training data) versus data it has never seen before (testing data). Models with poor generalizability have overfitted the training data (Overfitting problem). To build useful neural network models, data augmentation is a very powerful method to reduce overfitting by providing a more comprehensive set of possible data points to minimize the distance between the training and testing sets. Data augmentation is known to provide a solution to the problem of limited data in computer vision. However, in practice, in terms of augmenting agricultural image data captured in real-world agricultural fields, there exist many technical problems.

In an example, augmenting agricultural image data applying conventional image augmentation techniques although helps to some extent but in practice is not adequate, and results in erroneous results in detection of crop plants or foliage in a real time application hindering the accuracy and efficacy of these camera systems. Some augmentation techniques, like applying filters or adding synthetic objects, might introduce unrealistic features not typically seen in real fields. This can create a "domain mismatch" where the model performs well on augmented data but fails to generalize to real-world scenes. Furthermore, unlike controlled settings, agricultural fields are often uneven, with varying terrain, obstacles, and clutter, which makes it difficult to capture artifact-free images. In another example, conventional cameras are often calibrated for standard environments, making them less effective in the unique conditions of agricultural fields. This can lead to issues with color accuracy, perspective distortion, and image clarity. Examples of the unique conditions of agricultural fields include but are not limited to, a) the sunlight variation issue, i.e., sunlight constantly changes throughout the day, causing shadows, reflections, and variations in brightness; b) the mist issue, created by spraying of chemicals on agricultural fields causing a rainbow-like phenomenon in the camera field-of-view; c) shadow-on-plant, and d) lighting-induced color shifts. Applying conventional image augmentation may change color information of foliage, such as the appearance of normal green hues is transformed to yellowish tones, leading to misidentification of genuine foliage. Similarly, the appearance of brown hues is transformed to reddish brown or yellowish brown that leads to the miss identification of the different types of the soil. Therefore, the conventional methods of image augmentation mostly fail in agricultural applications, which in turn reduces the effectiveness of neural network models training (trained on conventionally augmented training data) resulting in increase in the false negatives and false positives detection, thereby adversely affecting the accuracy and reliability of the conventional system.

Further limitations and disadvantages of conventional and traditional approaches will become apparent to one of skill in the art through comparison of such systems with some aspects of the present disclosure as set forth in the remainder of the present application with reference to the drawings.

BRIEF SUMMARY OF THE DISCLOSURE

A camera apparatus and a method of augmenting agricultural image data for enhanced error handling, substantially as shown in and/or described in connection with at least one of the figures, as set forth more completely in the claims.

These and other advantages, aspects, and novel features of the present disclosure, as well as details of an illustrated embodiment thereof, will be more fully understood from the following description and drawings.

BRIEF DESCRIPTION OF DRAWINGS

Embodiments of the present disclosure will now be described, by way of example only, with reference to the following diagrams wherein.

DETAILED DESCRIPTION OF THE DISCLOSURE

Certain embodiments of the disclosure may be found in a camera apparatus, and a method of augmenting an agricultural image data for an enhanced error handling. The term "enhanced error handling" in the context of the camera apparatus and the method of augmenting agricultural image data refers to improved mechanisms and techniques for dealing with errors that may occur during the process of capturing, processing, or analyzing agricultural images. The disclosed camera apparatus and method of augmenting agricultural image data provides a new and improved approach to enriching agricultural image datasets for neural network model training, for example, for crop detection and/or foliage detection, leading to more robust and accurate crop detection models for real-world scenarios. The camera apparatus with its innovative soil region adjustment technique offers several technical advancements for training crop detection or foliage detection models. The disclosed camera apparatus and method improves soil-crop differentiation, whereby selectively adjusting the soil hue instead of applying generic filters, the invention preserves realistic color information within the foliage region. This avoids creating unrealistic color shifts that could mislead the model and maintains fidelity to real-world agricultural scenes. Furthermore, training on augmented images with diverse, adjusted soil colors exposes the model to a wider range of real-world conditions. This helps the model learn to differentiate crop plants from different soil types (e.g., dry soil, wet soil, cracked soil) and subtle color variations (yellowish-brown, reddish-brown, greyish brown, etc.) leading to improved robustness and generalizability in practical agricultural applications without increasing image processing complexity and latency. Furthermore, by selectively adjusting specific regions instead of manipulating the entire image, the invention requires less computational resources.

In the following description, reference is made to the accompanying drawings, which form a part hereof, and which are shown, by way of illustration, various embodiments of the present disclosure.

Figure 1A:
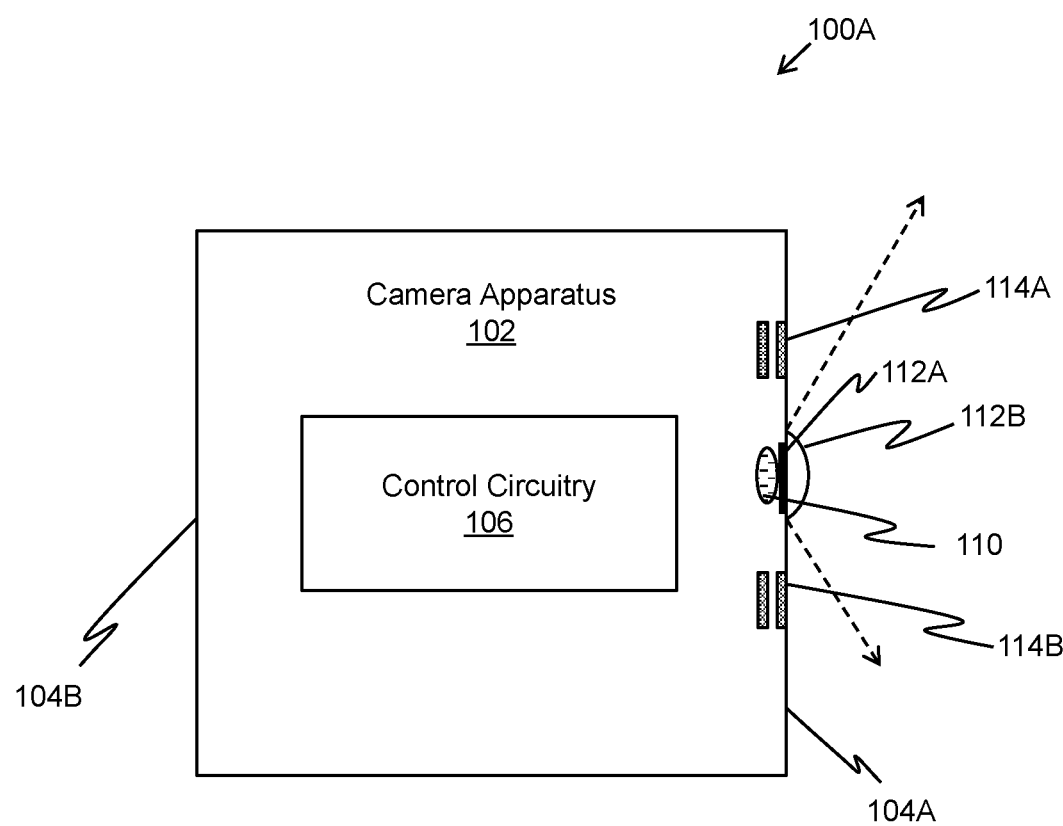
FIG. 1A is a diagram illustrating various exemplary components of a camera apparatus, in accordance with an embodiment of the present disclosure.

FIG. 1A is a diagram illustrating various exemplary components of a camera apparatus, in accordance with an embodiment of the present disclosure. With reference to FIG. 1A, there is shown a diagram 100A of a camera apparatus 102. The camera apparatus 102 may have a front side 104A and a rear side 104B. The camera apparatus 102 may include control circuitry 106. Furthermore, the front side 104A of the camera apparatus 102 may include an image sensor 110, a lens 112A, a lens protector 112B, and a plurality of light diffusers, such as a first light diffuser 114A and a second light diffuser 114B.

In an exemplary implementation, the camera apparatus 102 may be mounted in a vehicle, such as a tractor or any other agricultural vehicle. The camera apparatus 102 is configured to capture an input color image (e.g., a color image that captures a portion (e.g., 1.75-2.25 meters or approximately 2 meters) of an agricultural field comprising soil and foliage (e.g., plants that may include weeds and crop plants, hereinafter simply referred to as a foliage image) of an agricultural field. In an implementation, the camera apparatus 102 is configured to capture a wide field-of-view (FOV), for example, 1.75 to 2.25 meters of a physical agricultural field as compared to smaller FOV in conventional systems (typically less than 1.5 meters). In an implementation, the FOV corresponds to approximately 2 meters of the agricultural field. The FOV of the camera apparatus 102 is represented by dotted lines in FIG. 1A. In an implementation, the camera apparatus 102 may be oriented at a specific angle (e.g., 45 degrees or 60° degrees) in order to capture a few meters in a forward as well as in a downward direction, for example, up to 80-90 cm downwards or up to 1.7 to 2.25 meters ahead.

The control circuitry 106 may include suitable logic, circuitry, interfaces, and/or code that is configured to acquire an input color image of an FOV of an agricultural field. Examples of the control circuitry 106 may include, but are not limited to a system-on-module (SOM) processor, an integrated circuit, a co-processor, a microprocessor, a microcontroller, a complex instruction set computing (CISC) processor, an application-specific integrated circuit (ASIC) processor, a reduced instruction set (RISC) processor, a very long instruction word (VLIW) processor, a central processing unit (CPU), a state machine, a data processing unit, and other processors or circuits. Moreover, the control circuitry 106 may refer to one or more individual processors, processing devices, or a processing unit that is part of a machine.

In accordance with an embodiment, the front side 104A of the camera apparatus 102 may further comprise the lens 112A and the lens protector 112B that covers the lens 112A and the image sensor 110 of the camera apparatus 102. Alternatively stated, the lens 112A is positioned between the image sensor 110 and the lens protector 112B. The lens protector 112B may be configured as a filter screen to prevent dust particles and ultra-violet (UV) light from entering the image sensor 110 of the camera apparatus 102. The lens protector 112B may also be referred to as a lens protection filter that further protects from fogging. In an implementation, the lens protector 112B may be an anti-fogging glass that also protects the lens 112A and the image sensor 110 from dust, spray mist, and UV light.

In accordance with an embodiment, each of the first light diffuser 114A and the second light diffuser 114B may be configured to diffuse light emitted from a plurality of light sources, when the camera apparatus 102 is in operation to capture the input color image. The plurality of light sources may include, but is not limited to, light emitting devices (LED), strobe-lights integrated in a light control printed circuit board (PCB). The light control PCB further comprises capacitors to power the LED or strobe-lights (not shown for brevity). In an implementation, the rear side 104B of the camera apparatus 102 may comprise a passive heat sink (not shown) to dissipate heat generated by the control circuitry 106 (e.g., the SOM processor) of the camera apparatus 102.

In operation, the image sensor 110 is configured to capture an input color image of a field-of-view (FOV) of an agricultural field. The FOV of the input color image may range from 1.75 to 2.25 meters of the agricultural field. For example, 2 meters of agricultural fields that may include a substrate (such as soil) and foliage growing on the substrate, may be captured in the FOV.

The control circuitry 106 is configured to acquire the input color image in a Red, Green, and Blue (RGB) color space of a field-of-view (FOV) of the agricultural field. The input color image is acquired from the image sensor 110. In an implementation, the input color image may be raw sensor data (e.g., a Bayer's image) that is converted to the color image by demosaicing operation, known in the art. It is known that different color spaces represent colors in distinct ways, making certain features more visible or easier to isolate. For example, the RGB color channel represents red, green, and blue components, useful for defining color ranges.

The control circuitry 106 is further configured to detect one or more foliage regions in the input color image and generate an output binary mask image of foliage mask indicating the one or more foliage regions and a soil region. The output binary mask image refers to a black and white image that serves as a representation in which certain pixels having binary values as "0" and "1" are assigned indicating the one or more foliage regions and the soil region. For example, the white regions signify the presence of one or more foliage regions and the black color signifies the soil region. In another implementation, the white region may signify the presence of the soil region and the black region may signify the presence of the one or more foliage regions. The foliage may include crop plants only, or a combination of crop plants and weeds. In an implementation, the output binary mask image of foliage may be generated using an image processing pipeline or a custom neural network model, such as a foliage detection neural network model.

In accordance with an embodiment, the camera apparatus 102 further includes the Foliage Image Processing (FIP) component and the control circuitry 106 is configured to execute the FIP component on the acquired input color image in the RGB color space for the generation of the output binary mask image of foliage mask. The FIP component 120 is configured to generate the output binary mask image of the foliage mask (e.g., binary images of foliage mask) for one or more foliage regions present in the input color image (i.e., the foliage image) captured by the camera apparatus 102. The generation of the output binary mask image of foliage is described in detail, in FIGS. 4 and 5. In an implementation, the output binary mask image of foliage may be generated using a first image processing pipeline on execution of a Foliage Image Processing (FIP) component, for example, described in detail, in FIG. 4. In an implementation, the output binary mask image of foliage may be generated using a second image processing pipeline on execution of a Foliage Image Processing (FIP) component, for example, described in detail, in FIG. 5.

In accordance with an embodiment, the control circuitry 106 further includes the Foliage Detection (FD) neural network (NN) model and the control circuitry 106 is configured to execute the FD NN model on the acquired input color image in the RGB color space for the detection of the one or more foliage regions in the input color image and the generation of the output binary mask image of foliage mask. The FD NN model is trained for the foliage detection which includes the detection of crop plants as well as weed plants in an agricultural field. The output binary mask images with foliage masks (as explained in FIG. 3A) are used for training the FD NN model to obtain the trained FD NN model. The detection of the one or more foliage regions (i.e., how the one or more foliage regions are detected) has been described in detail, for example, in the co-pending U.S. application Ser. No. 18/401,066.

Furthermore, the control circuitry 106 is configured to convert the input color image from the RGB color space to a Hue, Saturation, Lightness (HSV) color space to obtain an HSV image. The HSV color space includes three components that include a Hue component (i.e., the type of color), a saturation component (i.e., the intensity or vividness of the corresponding color), and a lightness component (i.e., the brightness of the color). Moreover, the conversion of the color image from the RGB color space to the HSV color space enables the control circuitry 106 to further perform certain operations, for example, removal of unnecessary brightness, removal of any noise from the color image, and the like, that require modification or adjustment of any component of the HSV color space. In an implementation, the value of H is different for different colors, for example, for green color, H will have a certain value, for red color, H will have another value and the like. S (saturation) represents the amount of colors present in the smoothened input color image and V (value) is for brightness. For a given pixel, how bright is that pixel represented by V. The brighter regions of the smoothened input color image have larger values of V and darker regions have lower values of V. The conversion of the RGB color space to the HSV color space is used to facilitate further processing and analysis of the acquired color image in the HSV color space.

In accordance with an embodiment, the control circuitry 106 is further configured to modify a hue value of the first set of pixels of the HSV image corresponding to the soil region indicated by the output binary mask image of foliage mask by adding or subtracting a randomly chosen integer value in the range of 1 to 50 from the hue value of each pixel of the first set of pixels for the selective adjustment of the hue component of the HSV image. In an example, the control circuitry 106 is configured to add the integer value of 20 to the first set of pixels of the HSV image corresponding to the soil region indicated by the output binary mask image of the foliage mask. In another example, the control circuitry 106 is configured to add the integer value of 50 to the first set of pixels of the HSV image corresponding to the soil region indicated by the output binary mask image of the foliage mask. In yet another example, the control circuitry 106 is configured to subtract the integer value of 20 from the first set of pixels of the HSV image corresponding to the soil region indicated by the output binary mask image of the foliage mask. Moreover, the hue values are modified randomly by adding or subtracting the integer values from 1 to 50. Furthermore, by modifying the first set of pixels of the HSV image corresponding to the soil region indicated by the output binary mask mage, the control circuitry 106 is configured to control the color of the corresponding soil region and further identify the variability and diversity in color representation of the soil region. The selective adjustment of the hue component is used to simulate and consider different types of soil color (e.g., different variations of brown color) that may occur in real-world scenarios.

In accordance with an embodiment, the output binary mask image of foliage mask includes the first set of pixels with binary value "1" corresponding to the one or more foliage regions and a second set of pixels with binary value "0" corresponding to the soil region. The output binary mask image is indicative of the one or more foliage regions set in a first binary value (i.e., the binary value "1") set for the first set of pixels different from the second binary value (i.e., the binary value "0") set for the second set of pixels, which is indicative of the soil region.

In accordance with an embodiment, the control circuitry 106 is further configured to invert the output binary mask image of the foliage mask to obtain an inverted output binary mask image of the foliage mask in which the first set of pixels with the binary value "1" corresponding to the one or more foliage regions is re-assigned the binary value "0" and the second set of pixels with binary value "0" corresponding to the soil region is re-assigned the binary value "1" to allow processing of the second set of pixels for the selective adjustment of the hue component of the HSV image. The inversion of the binary values, for example, re-assigning the first set of pixels with the binary value "0" and the binary value "1" to the second set of pixels is used to allow the further processing (e.g., facilitating subsequent selective hue adjustments in the HSV image) of the second set of pixels that are indicative of the soil region without affecting the one or more foliage regions.

Furthermore, the control circuitry 106 is configured to selectively adjust a hue component of the HSV image corresponding to the soil region indicated by the output binary mask image of the foliage mask. The hue component (i.e., H) represents the pure color of a pixel, often measured on a circular scale of 0 to 360 degrees, where 0 is red, 120 is green, and 240 is blue. The thresholding of H>20 can include pixels with hue values below 20, filtering out reddish colors (like reddish brown or reddish hues which are more representative of soil) that can be further utilized for the detection of different types of soil. The expected hue range for the soil region may be between the reddish orange to yellowish-brown (approximately 150-180 degrees). The selective adjustment of the hue component of the HSV image corresponding to the soil region indicated by the output binary mask image of foliage mask is used to identify the soil regions accurately and reliably, such as by modifying the color representation of the soil regions to allow specific color manipulations in the soil areas without affecting other parts of the acquired input color image. Moreover, the degree of adjustment of the hue component is determined randomly within a predefined range to ensure natural-looking results, i.e., to represent sunlight variation and lighting observed in an agricultural field. By adjusting the hue component, the control circuitry 106 may be configured to simulate different types of color variations in order to detect different types of soils accurately and reliably with reduced false positives and false negatives.

Furthermore, the control circuitry 106 is configured to convert the selectively adjusted HSV image back to the RGB color space to obtain a soil region-adjusted RGB image. The HSV image is converted back to the RGB color space to integrate the specific color adjustments made in the soil regions back into the standard RGB representation. The obtained soil region adjusted RGB image encapsulates the specific color changes applied to the soil regions for further processing or analysis. As a result, the crop monitoring, and the detection of the different types of soil are improved accurately and efficiently. Additionally, the soil region adjusted RGB image can be used to identify and address different issues, for example, diseases in the soil, cracks in the soil, dry soil, wet soil, and the like, leading to better crop management.

Furthermore, the control circuitry 106 is configured to generate an augmented color image by combining pixels of the soil region from the soil region adjusted RGB image, with pixels of the one or more foliage regions unaltered from the acquired input color image in the RGB color space. In an implementation, the pixels from the soil region adjusted RGB image represent the variation of Brown color that can be further used to detect the different types of the soils (e.g., dry soil, wet soil, cracked soil, and the like). Moreover, the augmented color image refers to an image that includes multiple adjustments made in the soil regions while preserving the original appearance of the one or more foliage regions, providing a comprehensive and informative representation for further applications, such as for training the AI models (e.g., the FD NN model, and the CD NN model) for crop detection or for detecting the type of the soil. In traditional RGB images, the similarity in color and texture between soil and certain plant parts can lead to misclassification. The augmented images reduce this problem, leading to more accurate crop detection. By enhancing the contrast between soil and foliage, the neural network can more easily learn to differentiate between these features. This is particularly useful in agricultural settings where distinguishing between crops and bare soil is crucial.

The control circuitry 106 is further configured to utilize the generated augmented color image in the training of a crop detection (CD) neural network (NN) model to cause the CD neural network model to learn a plurality of different types of soil and a range of color variation of soil. The generated augmented color image comprises adjusted pixels representing the soil region and unaltered pixels representing the foliage region, and the like. The CD NN model is trained to discern and identify different types of soil present in agricultural fields, such as by recognizing a diverse spectrum of color variations (e.g., reddish-brown, yellowish-brown, brown, dark brown, and the like) within the soil. Moreover, the inclusion of the augmented data, such as by generating the augmented color image simulates the real-world variations that are further used to improve the robustness and accuracy of the CD NN model in identifying different soil types and colors during subsequent real-time applications. In other words, training with augmented images that have modified soil regions can make the neural network more robust to varying lighting conditions, soil types, and crop stages. With more accurate crop detection, camera-driven agricultural machines manifest improved precision spraying of chemicals, like plant nutrients, weedicides, herbicides, insecticides etc., resulting in improved crop management, potentially leading to improved yields. Accurate crop detection leads to more efficient use of resources like water, fertilizers, and pesticides, as the precise location and health of the crops are known. In an implementation, the method can be easily integrated into existing precision agriculture technologies, such as automated tractors, for real-time crop monitoring and management. The accuracy of model training, for crop detection and foliage detection is improved to more than 96%, generally found be in range of 96-99.999 percent, thereby manifesting enhanced error handling, i.e., almost negligible number to no errors (i.e., no false positives or false negatives).

In accordance with an embodiment, additionally, the control circuitry 106, in a training phase, is further configured to apply a plurality of different image level augmentation operations on a first set of input color images of the agricultural field or another agricultural field in a first training dataset to obtain a second set of augmented color images greater in number than the first set of input color images. Moreover, a combination of the second set of augmented color images and the first set of input color images in the form of a modified training dataset is further used for the training of the CD neural network model. In other words, the training phase includes the execution of a series of plurality of different image level augmentation operations on the first set of input color images of the agricultural field or another agricultural field on the acquired input color images. Moreover, the plurality of different image-level augmentation operations includes augmentation operations, such as mosaicking, masking partial plants, adjusting the hue, introducing shadows, flipping, rotating, and the like. The combination of the second set of augmented color images and the first set of input color images in the form of the modified training dataset includes both the acquired input color images and the augmented versions of the corresponding input color images to provide a vast variety of images that can be further utilized to train the CD NN model accurately with reduced false positives and false negatives. Furthermore, the plurality of different image-level augmentation operations is designed to simulate different conditions and variations that the Crop Detection (CD) neural network model may encounter in real-world scenarios. An example of the plurality of different image-level augmentation operations is further described in detail, for example, in FIG. 3A.

In accordance with an embodiment, the control circuitry 106, in the training phase, is further configured to apply a dataset-level augmentation in addition to the plurality of different image-level augmentation operations. The control circuitry 106 is configured to incorporate the dataset-level augmentation. Unlike image-level augmentations that are applied to individual images, dataset-level augmentation includes the addition of different variations (e.g., color images with false positives and false negatives) to the complete set or collection of images used for training. Moreover, the dataset level augmentation is applied to further diversify the training dataset. It involves introducing broader variations or transformations across the complete collection of images, contributing to a more comprehensive and adaptable training set. Therefore, the combination of the plurality of image-level augmentation operation and the dataset-level augmentation enhances the overall accuracy of the CD NN model in identifying the different types of soils.

Advantageously, the camera apparatus 102 is configured to provide the accurate and the reliable training of the neural network models (e.g., the FD NN model and the CD NN model), when the neural network models in the foliage detection or crop detection models are trained a number of augmented color images, such as the generated augmented color image. The soil adjusted RGB pixels are used to recognize diverse soil types and color variations thereby, enhancing the robustness, effectiveness, and the accuracy of the FD NN model and the CD NN model, while maintaining the accuracy of crop detection by retaining the RGB pixels of foliage, thereby contributing to improved crop monitoring and management.

Figure 1B:
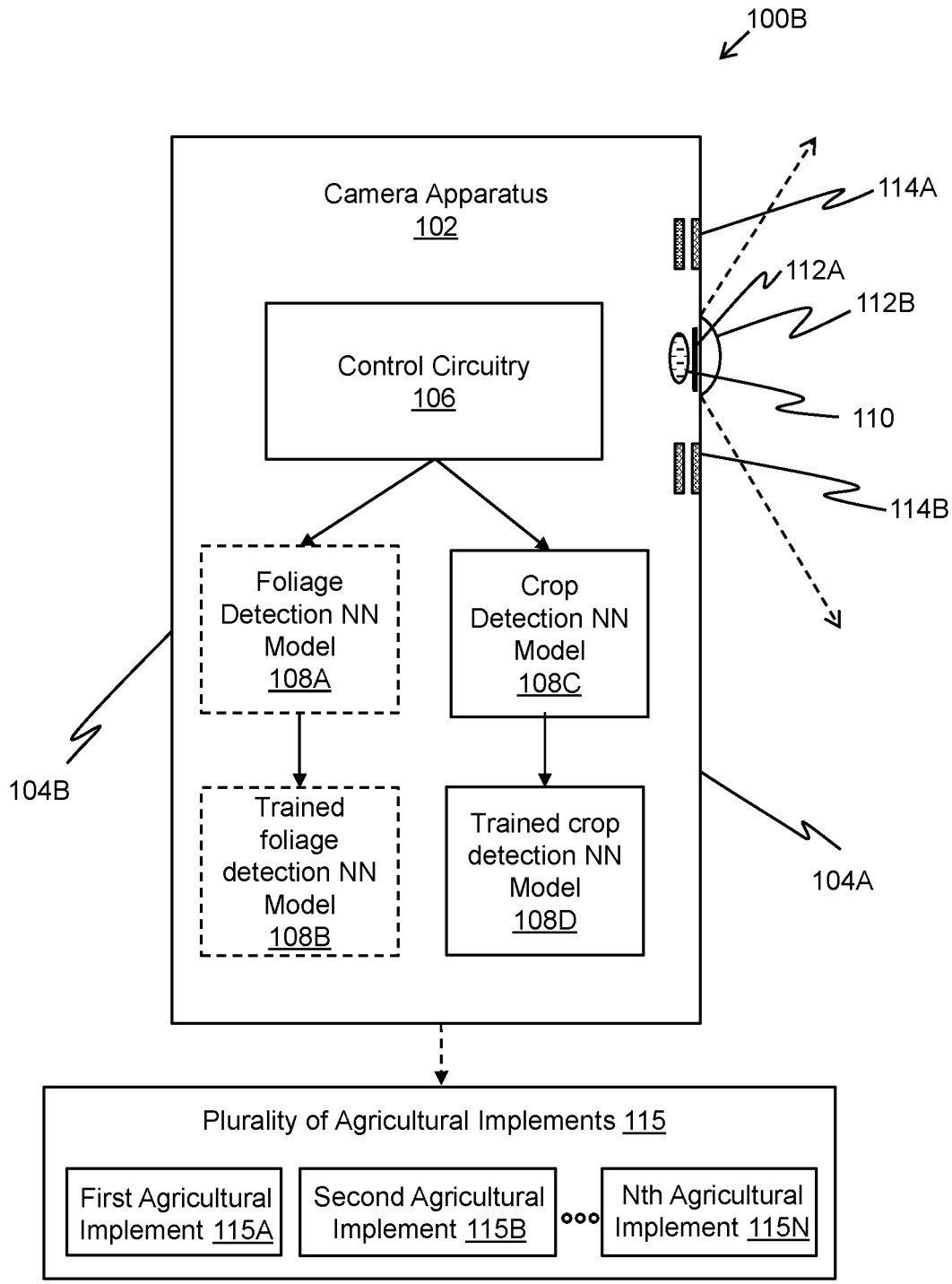
FIG. 1B is a diagram illustrating various exemplary components of a camera apparatus, in accordance with another embodiment of the present disclosure.

FIG. 1B is a diagram illustrating various exemplary components of a camera apparatus, in accordance with another embodiment of the present disclosure. With reference to FIG. 1B, there is shown a diagram 100B of the camera apparatus 102. The camera apparatus 102 may include a foliage detection (FD) Neural Network (NN) model 108A, a trained foliage detection (FD) NN model 108B, a crop detection (CD) NN model 108C, and a trained crop detection (CD) neural network (NN) model 108D in addition to the components shown and described, for example, in the FIG. 1A. Furthermore, the control circuitry 106 may be configured to operate at least one of a plurality of agricultural implements 115, such as a first agricultural implement 115A, based on at least the generated output binary mask image of foliage mask. The plurality of agricultural implements 115 may include N agricultural implements, such as the first agricultural implement 115A, a second agricultural implement 115B, and up to a Nth agricultural implement 115N.

The FD NN model 108A and the CD NN model 108C may be a deep neural network (DNN) model, such as a convolution neural network (CNN) model, which is customized and re-configured in a two-branch architecture or a three-branch architecture for execution of a training phase for foliage detection and for the detection of different type of soils respectively. An example of the three-branch architecture is shown and described, for example, in FIG. 4. An example of the two-branch architecture is shown and described, for example, in FIG. 5. The FD NN model 108A is subjected to a training phase, where the FD NN model 108A is configured to learn not only a plurality of features related to foliage but also a color variation range of a predefined color (e.g., different shades of green color) associated with the plurality of features, which significantly enhances the training performance to detect the foliage with improved accuracy and reliability. Similarly, the CD NN model 108C is subjected to a training phase, where the CD NN model 108C is configured to learn not only a plurality of features related to the soil but also a color variation range of a predefined color (e.g., different shades of brown color) associated with the plurality of features, which significantly enhances the training performance to detect the different type of soils with improved accuracy and reliability.

Typically, an off-the-shelf or conventional CNN models operate by learning features from images and then predicting similar features when a new image is captured in an operational phase. In contrast to the conventional systems, the CNN model is custom-configured and specially designed for training for the specific purpose of foliage detection in agricultural environments. For instance, a CNN model is custom-configured to obtain the FD NN model 108A and the CD NN model 108C by branching the convolution neural network model into a plurality of different types of training branches, where a first type of training branch of the plurality of different types of training branches is configured for the learning of the plurality of features related to foliage from the modified training dataset, and where a second type of training branch of the plurality of different types of training branches is configured for the learning of the color variation range of the predefined color associated with the plurality of features.

The trained FD NN model 108B is a trained version of the FD NN model 108A and is subjected to an operational phase. Alternatively stated, the trained FD NN model 108B is configured to detect one or more foliage regions in an input color image captured by the camera apparatus 102 in a real time or near real time in the agricultural filed or a different agricultural field. Similarly, the trained CD NN model 108D is a trained version of the CD NN model 108D and is subjected to the operational phase. Alternatively stated, the trained CD NN model 108D is configured to detect the plurality of different types of soil, such as by detection a range of color variations of the soil in an input color image captured by the camera apparatus 102 in a real-time or near real-time in the agricultural filed or a different agricultural field.

In an implementation, the training of the FD NN model 108A may be performed in the camera apparatus 102. Alternatively stated, the control circuitry 106 is configured to execute the training phase of the FD NN model 108A in the camera apparatus 102. In another implementation scenario, the training of the FD NN model 108A may be performed outside the camera apparatus 102, for example, a computing device or at a training server, described in detail, for example, in FIG. 1C, and then the trained FD NN model 108B may be deployed in the camera apparatus 102 for the operational phase.

Similarly, in an implementation, the training of the CD NN model 108C may be performed in the camera apparatus 102. Alternatively stated, the control circuitry 106 is configured to execute the training phase of the CD NN model 108C in the camera apparatus 102. In another implementation scenario, the training of the CD NN model 108C may be performed outside the camera apparatus 102, for example, a computing device or at a training server, described in detail, for example, in FIG. 1C, and then the trained CD NN model 108D may be deployed in the camera apparatus 102 for the operational phase.

Examples of implementation of the first agricultural implement 115A may include, but is not limited to, a sprayer comprising a plurality of electronically controllable spray nozzles and a cutter comprising a plurality of electronically controllable cutting blades (e.g., for lettuce thinning). Examples of implementation of the second agricultural implement 115B may include, but is not limited to, a precision spot sprayer comprising a plurality of electronically controllable spray nozzles for spraying weedicide on the one or more weed regions in the agricultural field and a cutter comprising a plurality of electronically controllable cutting blades (e.g., for uprooting weeds), a laser-based device to emit laser beams on the one or more weed regions, or other means of killing, uprooting, pruning, or dislocating weeds, described in detail, for example, in FIGS. 13A to 13F.

Figure 1C:
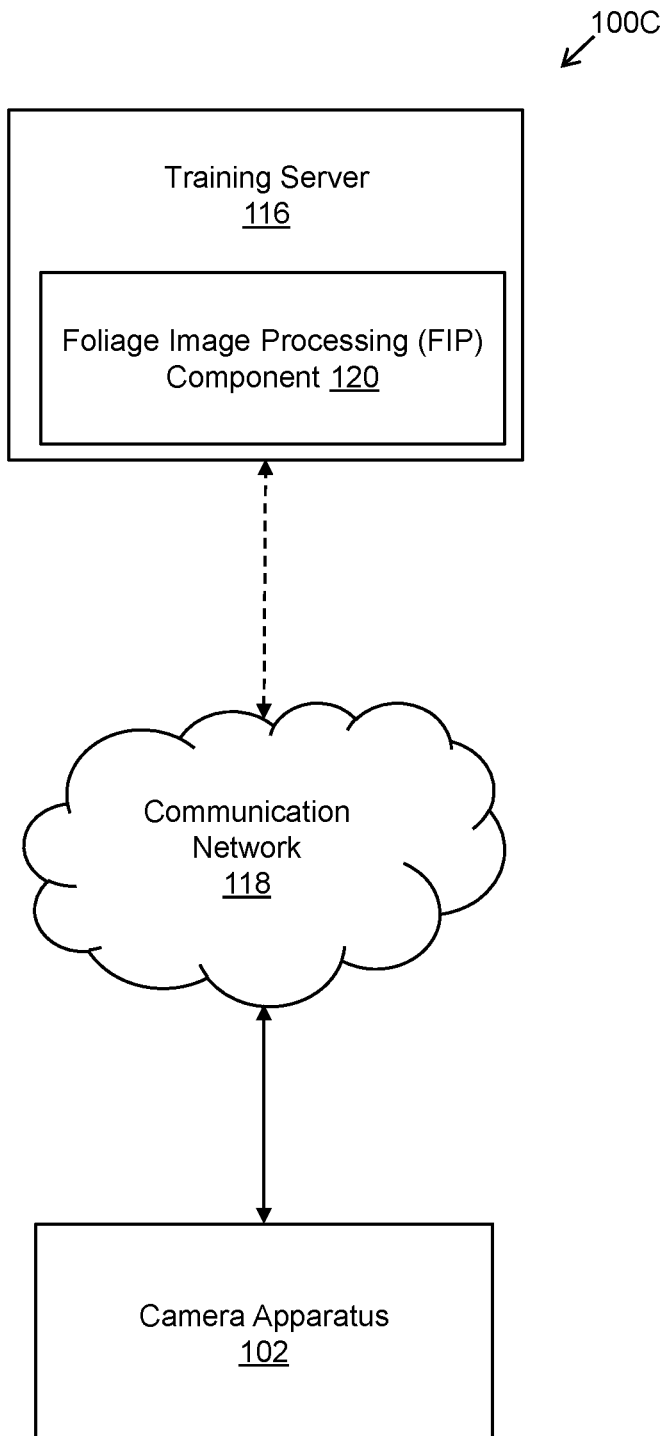
FIG. 1C is a network environment diagram of a camera apparatus, in accordance with an embodiment of the present disclosure.

FIG. 1C is a network environment diagram of a camera apparatus, in accordance with an embodiment of the present disclosure. FIG. 1C is described in conjunction with elements from FIGS. 1A and 1B. With reference to FIG. 1C, there is shown a network environment diagram 100C that comprises the camera apparatus 102 (of FIG. 1A), a training server 116, and a communication network 118. There is further shown a foliage image processing (FIP) component 120 in the training server 116. In some implementations, the FIP component 120 may be a part of the camera apparatus 102.

In this embodiment, the training of the FD NN model 108A and the CD NN model 108C may be performed in the training server 116. Due to the execution of the training phase in the training server 116, the FIP component 120 may be provided in the training server 116. The FIP component 120 is configured to generate masks for one or more foliage regions (e.g., binary images of foliage mask) present in the input color image (i.e., the foliage image) captured by the camera apparatus 102.

Examples of the training server 116 may include, but are not limited to, a cloud server, an application server, a storage server, or a combination thereof. Moreover, the training server 116 may either be a single hardware server or a plurality of hardware servers operating in a parallel or distributed architecture to execute the training phase of the FD NN model 108A and the CD NN model 108C. In an implementation, all the operations of augmenting agricultural image data for enhanced error handling executed at the camera apparatus 102 may be performed in the training server 116 except capture of images.

The communication network 118 may include suitable logic, circuitry, interfaces, and/or code that is configured to connect the camera apparatus 102 to the training server 116. Examples of the communication network 118 may include, but are not limited to, a cellular network (e.g., a 5G, or 5G NR network, such as sub 6 GHZ, cmWave, or mmWave communication network), a wireless sensor network (WSN), a cloud network, a Local Area Network (LAN), a vehicle-to-network (V2N) network, a Metropolitan Area Network (MAN), and/or Internet.

Figure 2A:
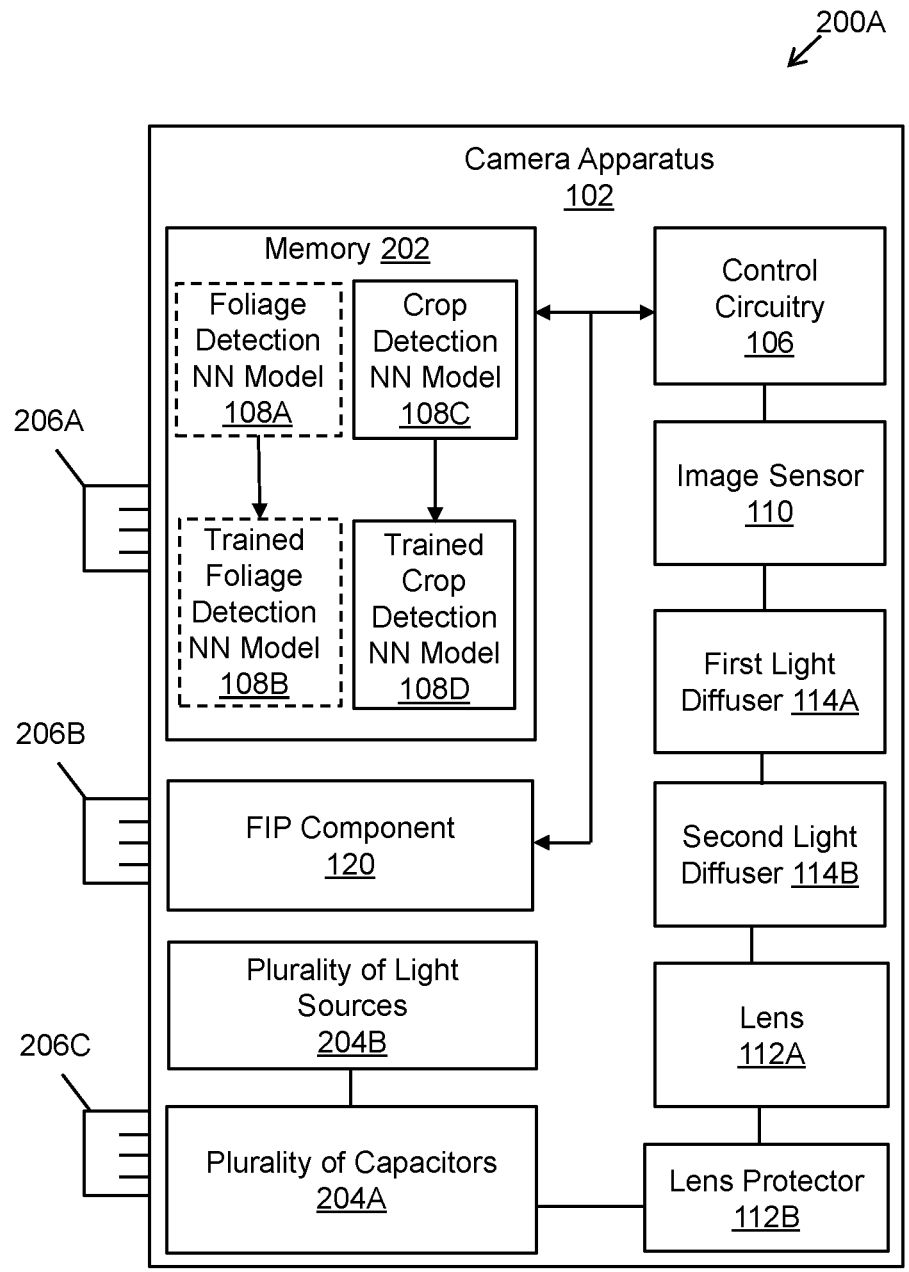
FIG. 2A is a block diagram illustrating various exemplary components of a camera apparatus, in accordance with another embodiment of the present disclosure.

FIG. 2A is a block diagram illustrating various exemplary components of a camera apparatus, in accordance with another embodiment of the present disclosure. FIG. 2A is described in conjunction with elements from FIGS. 1A, 1B and 1C. With reference to FIG. 2A, there is shown a block diagram 200A of the camera apparatus 102 (of FIG. 1A). The camera apparatus 102 may further include a memory 202, a plurality of capacitors 204A, a plurality of light sources 204B, and a plurality of connectors, such as a first connector 206A, a second connector 206B and a third connector 206C in addition to the components shown and described, for example, in the FIG. 1A.

The memory 202 may include suitable logic, circuitry, interfaces, and/or code that is configured to store machine code and/or instructions executable by the control circuitry 106. Examples of implementation of the memory 202 may include, but are not limited to, a Solid-State Drive (SSD), an Electrically Erasable Programmable Read-Only Memory (EEPROM), Random Access Memory (RAM), Read Only Memory (ROM), Hard Disk Drive (HDD), Flash memory, a Secure Digital (SD) card, a computer-readable storage medium, and/or CPU cache memory. The memory 202 is configured to store the FD NN model 108A, the CD NN model 108C, the trained FD NN model 108B, and the trained CD NN model 108D. The memory 202 may store an operating system and/or a computer program product to operate the camera apparatus 102. A computer-readable storage medium for providing a non-transient memory may include, but is not limited to, an electronic storage device, a magnetic storage device, an optical storage device, an electromagnetic storage device, a semiconductor storage device, or any suitable combination of the foregoing. In FIG. 2A, both the FD NN model 108A and the trained FD NN model 108B are stored in the memory 202. In another implementation, the FD NN model 108A may not be stored and the trained foliage detection (FD) NN model 108B may be stored in the memory 202. Similarly, in FIG. 2A, the CD NN model 108C, and the trained CD NN model 108D are stored in the memory 202. In another implementation, the CD NN model 108C may not be stored and the trained CD NN model 108D may be stored in the memory 202.

Each of the plurality of capacitors 204A may be used to supply consistent power to the plurality of light sources 204B (such as LED or strobe lights) to generate high-intensity light flashes for a very short duration in sync with the operation of the image sensor 110 of the camera apparatus 102 to capture a first set of input color images of the agricultural field.

In an implementation, the first connector 206A may be used as a power supply port to power the camera apparatus 102. The second connector 206B is configured to connect to one or more agricultural implements, such as a chemical sprayer or a mechanical implement to actuate cutting blades, to actuate the one or more agricultural implements, devices, or tools. In an implementation, the second connector 206B may include multiple pins that can handle multiple actuation units, concurrently. For example, the camera apparatus 102 may include an integrated PCB that includes a plurality of actuators (e.g., 6-20 actuator chips) that may handle a plurality of electronically controllable spray valves in a sprayer. The third connector 206C is configured to establish a network with other camera apparatuses or other devices (e.g., a display apparatus) mounted in an agricultural vehicle or machine. In an example, the network may be a local area network (LAN) connection.

Figure 2B:
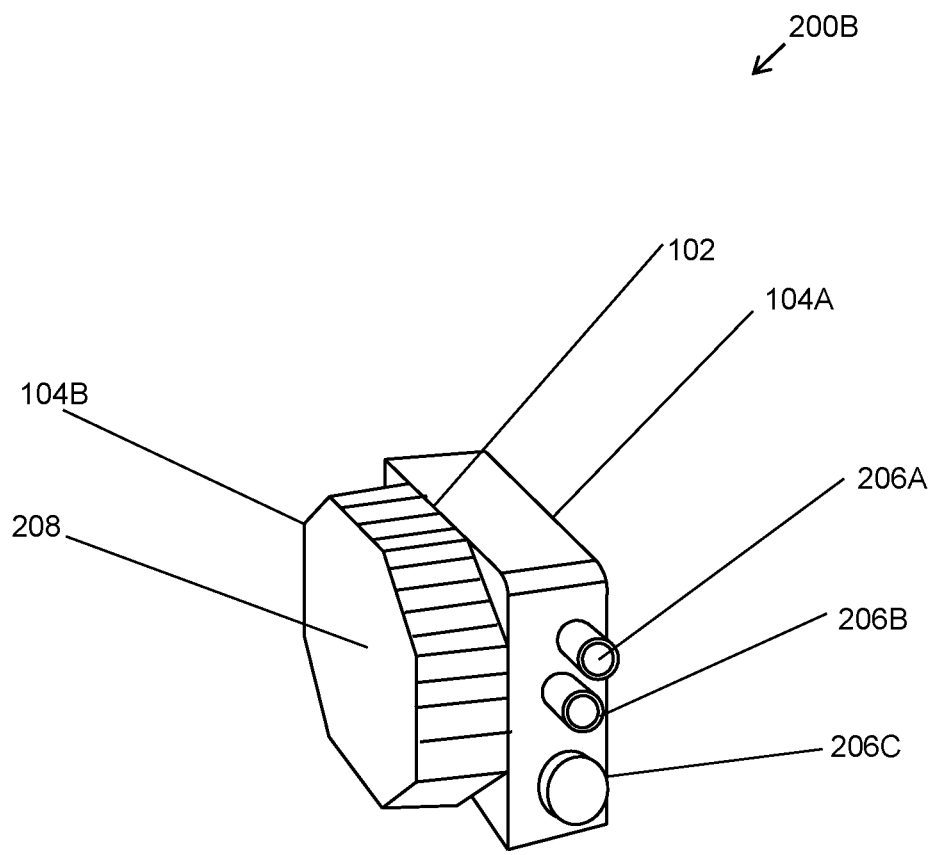
FIG. 2B is a diagram illustrating perspective rear view of a camera apparatus, in accordance with an embodiment of the present disclosure.

FIG. 2B is a diagram illustrating a perspective rear view of a camera apparatus, in accordance with an embodiment of the present disclosure. FIG. 2B is described in conjunction with elements from FIGS. 1A-1C, and 2A. With reference to FIG. 2B, there is shown a perspective rear view 200B of the camera apparatus 102.

The perspective rear view 200B of the camera apparatus 102 shows the rear side 104B of the camera apparatus 102, and each of the plurality of connectors, such as the first connector 206A, the second connector 206B, and the third connector 206C. The plurality of connectors may be provided at the lateral side of the camera apparatus 102. The rear side 104B of the camera apparatus 102 comprises a passive heat sink 208. The passive heat sink 208 is used to dissipate the heat generated by one or more processors, such as the control circuitry 106 of the camera apparatus 102.

Figure 2C:
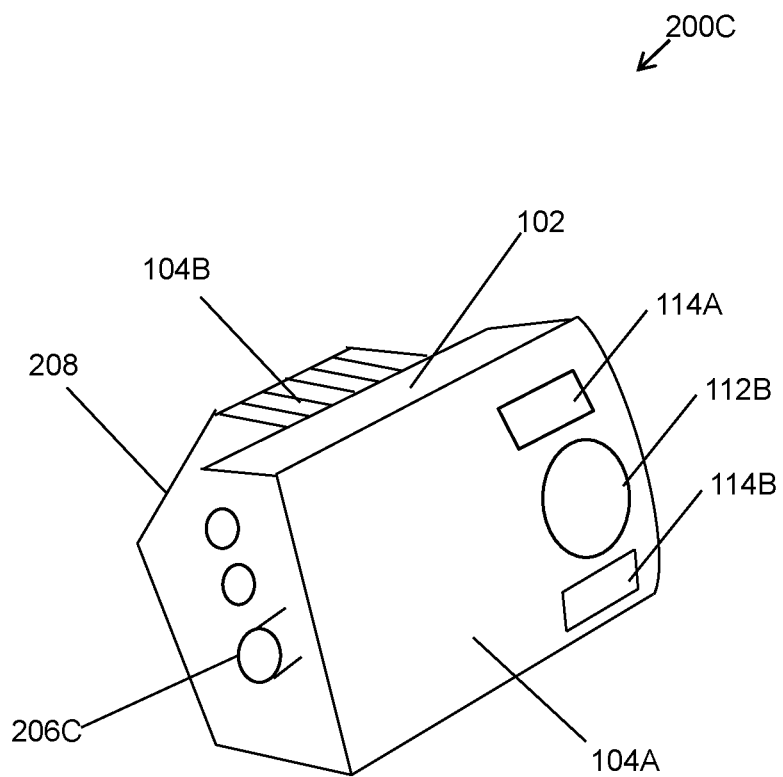
FIG. 2C is a diagram illustrating perspective front view of a camera apparatus, in accordance with an embodiment of the present disclosure.

FIG. 2C is a diagram illustrating a perspective front view of a camera apparatus, in accordance with an embodiment of the present disclosure. FIG. 2C is described in conjunction with elements from FIGS. 1A-1C, 2A, and 2B. With reference to FIG. 2C, there is shown a perspective front view 200C of the camera apparatus 102.

The perspective front view 200C of the camera apparatus 102 shows the front side 104A of the camera apparatus 102. The front side 104A of the camera apparatus 102 comprises the image sensor 110, the lens protector 112B, and the plurality of light diffusers, such as the first light diffuser 114A and the second light diffuser 114B. A plurality of light sources (not shown) is disposed around the image sensor 110 at two or more concentrated regions behind the first light diffuser 114A and the second light diffuser 114B.

Figure 2D:
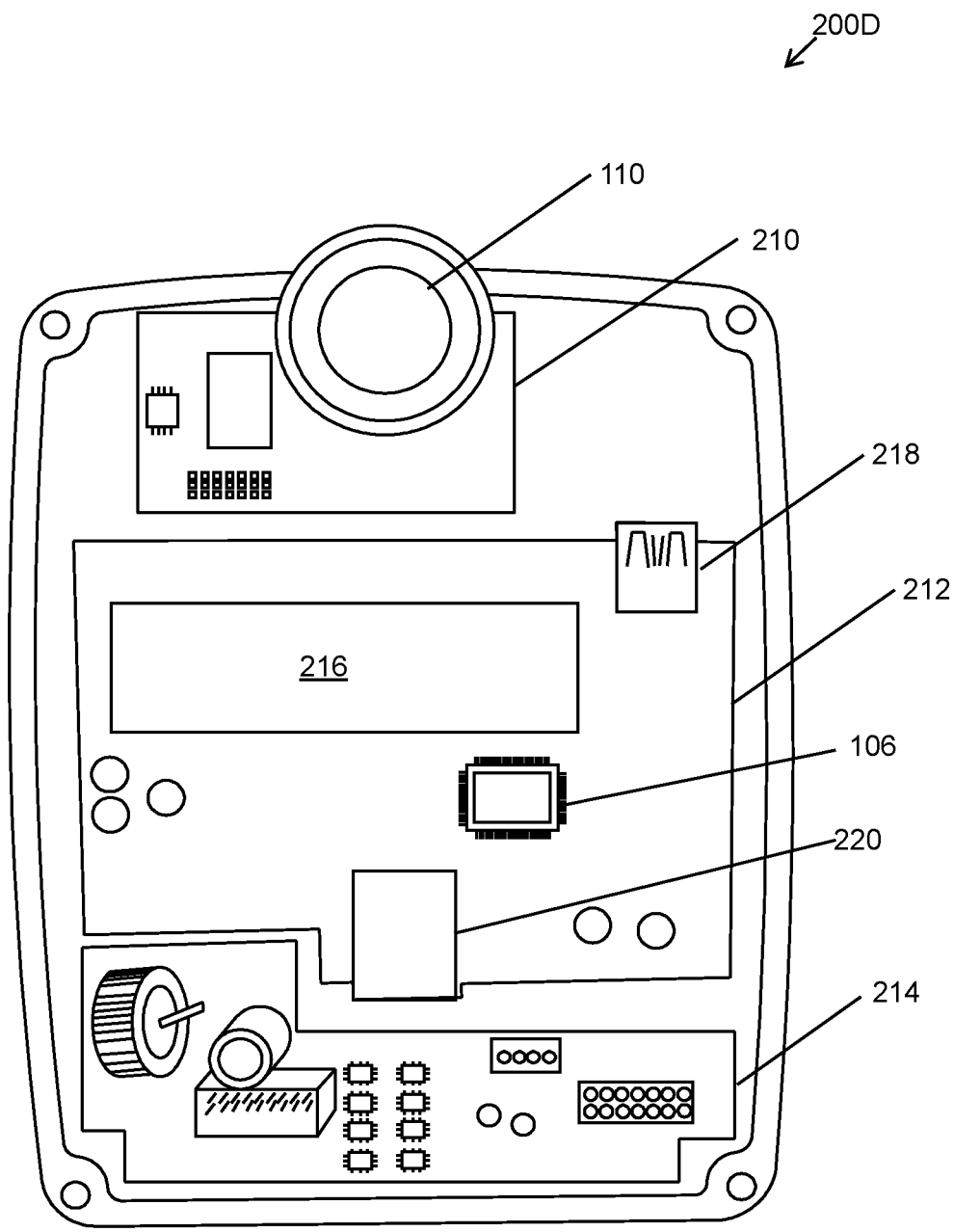
FIG. 2D is a diagram illustrating internal components of a camera apparatus, in accordance with an embodiment of the present disclosure.

FIG. 2D is a diagram illustrating various internal components of a camera apparatus, in accordance with an embodiment of the present disclosure. FIG. 2D is described in conjunction with elements from FIGS. 1A-1C, 2A, 2B, and 2C. With reference to FIG. 2D, there are shown a first printed circuit board (PCB) 210, a second PCB 212, and a third PCB 214. The first PCB 210 is configured as an image sensing and light control board, the second PCB 212 is configured as a custom-designed motherboard and the third PCB 214 is configured as a power supply board. The first PCB 210 comprises the image sensor 110. The plurality of light sources 204B (not shown here) may be strobe LED PCBs (e.g., different PCBs) arranged on different regions (e.g., either side) of the first PCB 210 serving as strobe light with LED and capacitors, such as the plurality of capacitors 204A. In an example, the plurality of light sources 204B may be disposed around the image sensor 110 at two or more concentrated regions and powered by the plurality of capacitors 204A. The second PCB 212 comprises a storage device 216 (e.g., a solid-state drive (SSD), a universal serial bus (USB) port 218, and an ethernet module 220. The control circuitry 106 is integrated into the second PCB 212. The third PCB 214 is configured to power the components of the first PCB 210 and the second PCB 212. The third PCB 214 comprises a number of actuators (e.g., actuator chips) and DC-to-DC converters.

Figure 3A:
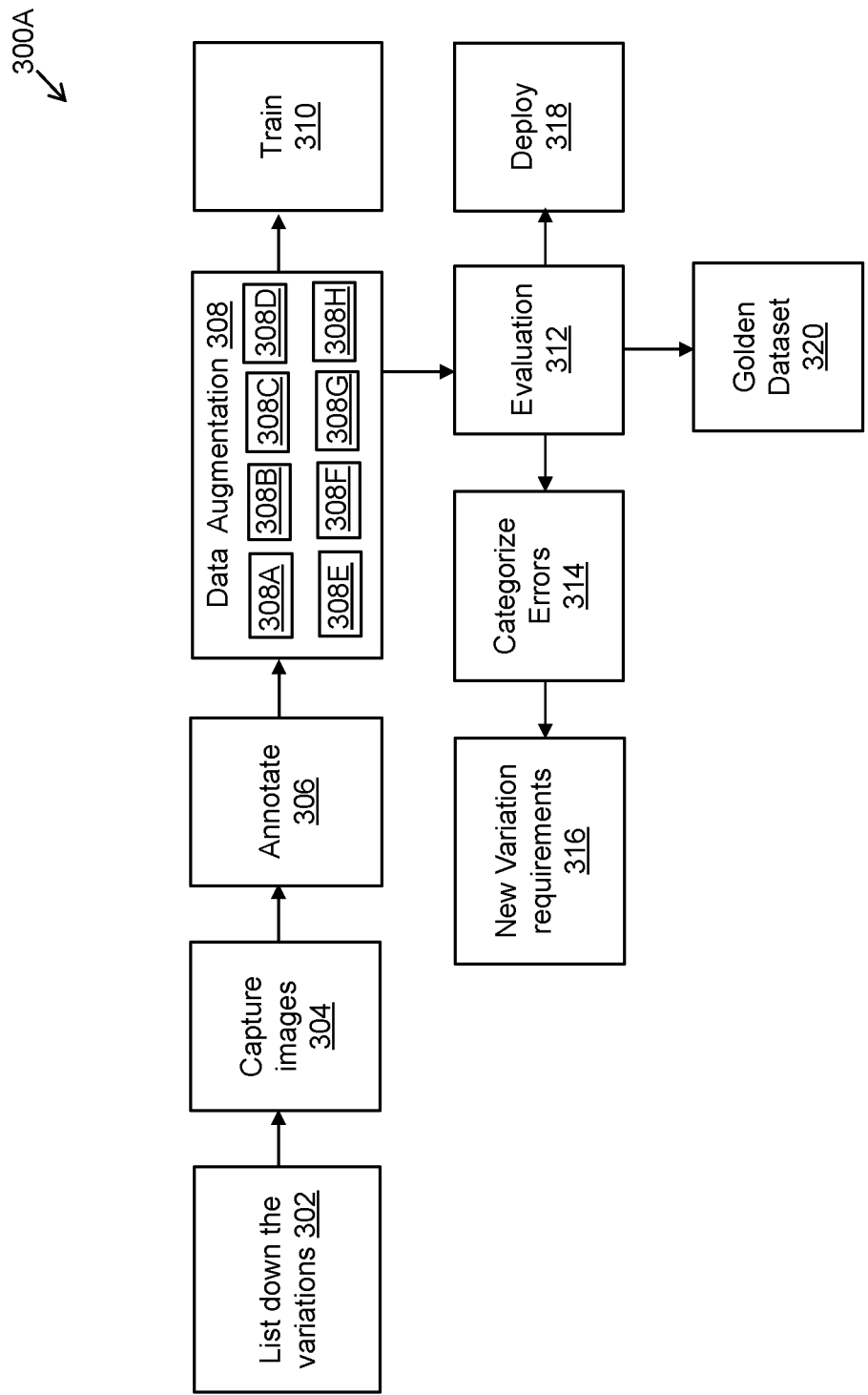
FIG. 3A is a diagram illustrating a training phase of a crop detection (CD) neural network (NN) model, in accordance with an embodiment of the present disclosure.

FIG. 3A is a diagram illustrating a training phase of a crop detection (CD) neural network (NN) model, in accordance with an embodiment of the present disclosure. FIG. 3A is described in conjunction with elements from FIGS. 1A-1C, and 2A-2D. With reference to FIG. 3A, there is shown a training phase 300A of the CD NN model 108C. The training phase of the CD NN model includes operations 302 to 320.

At operation 302, the control circuitry 106 is configured to list the variations in the collected data. In an implementation, the variations in the collected data may include but are not limited to an age group (e.g., 10 days, 20 days, 30 days, and the like) of the crop plant, time of capture (e.g., 8 AM to 10 AM, 10 AM to 12 PM, 12 PM to 2 PM, 2 PM to 4 PM, 4 PM to 6 PM, 6 PM to 8 PM, and the like), lighting (e.g., bright light during sunny day, dull light during cloudy, artificial light (during night time), and the like), weed density (e.g., no weed, low weed, medium weed, and high weed), soil conditions (e.g., wet soil, dry soil, cracked soil, and the like), disease severity (e.g., highly affected crop plant, medium effected and low or not affected crop plants). In addition, the variations in the collected data may also include region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like).

At operation 304, the control circuitry 106 is configured to capture the input color images of the field of view (FOV) of the agricultural field. For example, one million color images may be captured initially by the image sensor 104 (of the camera apparatus 102). In another implementation, more than one million color images can be captured by the image sensor 104 of the camera apparatus 102. The camera apparatus 102 may be configured to capture the first set of input color images of one or more agricultural fields. For example, agricultural fields of crop plants like chili, brinjal, lettuce, potato, tomato, cabbage, cauliflower, carrot, radish, cotton, and the like may be captured. Such agricultural fields may also include different varieties of weeds along with crop plants. In the training phase, thousands of different images (e.g., images of a cotton plants or other crop plants) may be captured in different locations, different positions (e.g., towards the sun), at different time of day (e.g., early morning, evening, or night), and at different growth stages (e.g., two-day cotton plant, three-day cotton plant), or different heath state may be used. Various soil types like brown soil, greenish soil, black soil, and cracks on soil, i.e., different texture and color of soil may be included in the first training dataset. A FOV of approximately 2 meters may be used to capture the first set of input color images of one or more agricultural fields.

At operation 306, the control circuitry 106 is configured to annotate the captured images with bounding boxes around the crop plant. The control circuitry 106 is configured to collect data from the agricultural fields for the plant of interest (e.g., cotton plant, chili plant, tomato, and the like). Thereafter, the control circuitry 106 is configured to annotate the captured images in order to get the required color image that can be further utilized to train the AI model (e.g., the FD NN model 108A and the CD NN model 108C). The annotation of the captured color images is used to avoid ambiguity and ensures accurate training of the CD NN model 108C and the FD NN model 108A.

At operation 308, the annotated image data undergoes different image level augmentation operations, such as mosaicking image level augmentation operation (i.e., operation 308A), masking partials image level augmentation operation (i.e., operation 308B), scaling image level augmentation operation (i.e., operation 308C), selective HSV image level augmentation operation (i.e., operation 308D), rotation image level augmentation operation (i.e., operation 308E), shadow image level augmentation operation (i.e., operation 308F), translation image level augmentation operation (i.e., operation 308G), and a flipping image level augmentation operation (i.e., operation 308H). In addition, the dataset-level augmentation in addition to the plurality of different image-level augmentation operations are also applied to the acquired color input images. The control circuitry 106 is configured to incorporate the dataset-level augmentation. The combination of the plurality of image-level augmentation operation and the dataset-level augmentation enhances the overall accuracy of the CD NN model 108C in identifying the different types of soils.

At operation 310, the control circuitry 106 is configured to utilize the generated augmented color image in the training of a crop detection (CD) neural network (NN) model 108C to cause the CD neural network model 108C to learn a plurality of different types of soil and a range of color variation of soil.

At operation 312, the CD NN model 108C is evaluated, such as by comparing the CD NN model 108C with a golden dataset (i.e., at operation 320). Moreover, the golden dataset refers to a dataset that includes a set of color images with variations and is considered as a reference for the evaluation of the accuracy level of the CD NN model 108C.

At operation 318, the CD NN model 108C is deployed to the camera apparatus 102 in order to allow the camera apparatus 102 to detect the plurality of different types of soils. In an implementation, if the accuracy of the CD NN model 108C is beyond a certain threshold, then in that case, the CD NN model 108C is deployed. Alternatively, if the accuracy of the CD NN model 108C is less than the threshold, then in that case, the CD NN model 108C is not deployed.

At operation 314, the control circuitry 106 is configured to perform error characterization. Moreover, the error categorization corresponds to a categorization of errors in different categories based on the number and severity of the errors (i.e., false negative and false positive). In an implementation, the number of errors can be further ranked and prioritized accordingly in order to fix the corresponding errors that lead to an enhancement of the accuracy of the CD NN model 108C. In other words, the images that include the plants or the soil regions that are not detected are collected. After that, the collected images are categorized into different categories of errors, such as a false negative category and a false positive category. In an implementation, the false negative category includes the images that show, small plants that cannot be identified, diseased plants, images having less confidence level than a pre-defined threshold value, having insertion over union (IOU) less than a threshold (e.g., 50%), images with weed occlusion, images in which the plants or soil regions are hard to identify, and the like. In another implementation, the false positive category includes images that show a broad leaf that cannot be identified as a crop or a weed, a plant that looks similar to the plant of interest, diseased plant, random objects, partial representation of the crop plant or the soil regions, image with narrow leaf and is hard to identify, and the like. Moreover, the categorization of the errors can be performed manually, such as by a user, or through semi-automated methods or techniques.

After the categorization of the errors, the control circuitry 106 is configured to identify the new variation requirements, such as at operation 316. Moreover, such identification of the new variation requirements is further utilized by the control circuitry 106 to train the CD NN model 108C. Therefore, the camera apparatus 102 is configured to allow the CD NN model 108C to learn the plurality of different types of soil variations effectively and accurately. In addition, the evaluation of the CD NN model 108C, performing error characterization, and the identification of the new variation requirements ensures a continuous improvement and adaptation to real-world scenarios thereby, enhancing the accuracy of the soil detection in the agricultural field.

Figure 3B:
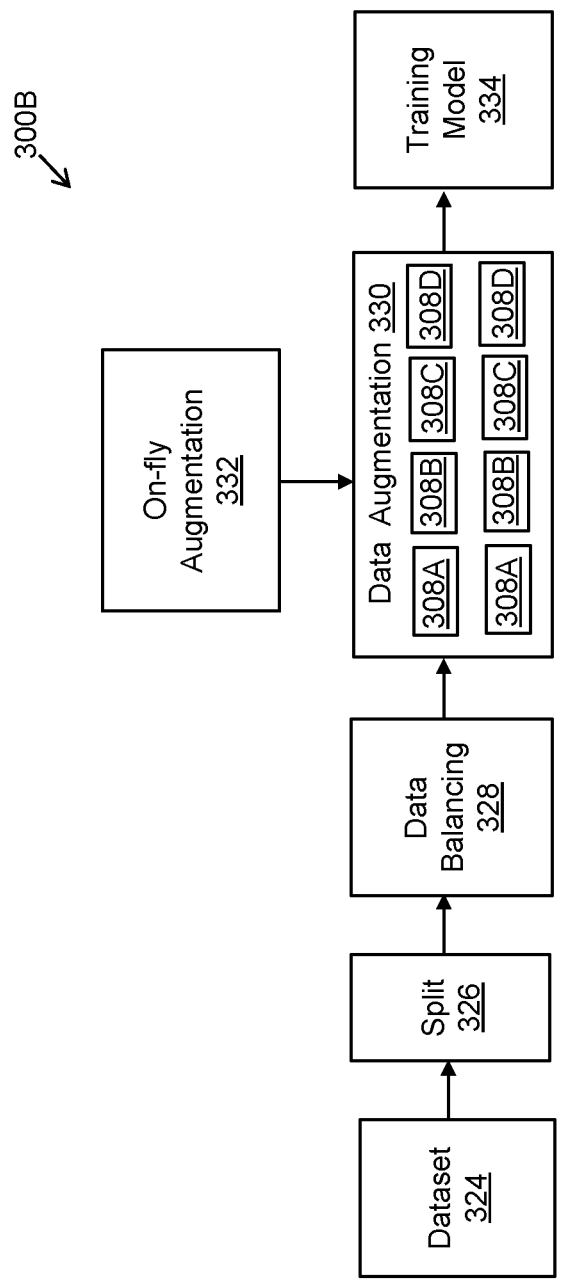
FIG. 3B is a diagram that depicts a flowchart for handling data variations with data augmentation, in accordance with an embodiment of the present disclosure.

FIG. 3B is a diagram that depicts a flowchart for handling data variations with data augmentation, in accordance with an embodiment of the present disclosure. FIG. 3B is described in conjunction with elements from FIGS. 1A-1C, 2A-2D, and 3A. With reference to FIG. 3B, there is shown a flow chart 300B for handling data variations with data augmentation. As shown in FIG. 3B, the flow chart 300B includes a series of operations 324 to 334.

At operation 324, the control circuitry 106 is configured to receive an image dataset after the annotation of the color input image data, which is captured by the image sensor 104. Furthermore, at operation 326, the received data set gets split into three different categories, such as a training dataset, a validation dataset, and a testing dataset. After that, at operation 328, the data is balanced according to the different variations, such as the age group (e.g., 10 days, 20 days, 30 days, and the like) of the crop plant, the time of capture (e.g., 8 AM to 10 AM, 10 AM to 12 PM, 12 PM to 2 PM, 2 PM to 4 PM, 4 PM to 6 PM, 6 PM to 8 PM, and the like), the lighting (e.g., bright light during sunny day, dull light during cloudy, the artificial light (during night time), and the like), the weed density (e.g., no weed, low weed, medium weed, and high weed), the soil conditions (e.g., wet soil, dry soil, cracked soil, and the like), the disease severity (e.g., highly affected crop plant, medium effected and low or not affected crop plants). In addition, the variations in the collected data may also include the region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like). An example of the data augmentation is described in detail in FIG. 3C. Furthermore, at operation 330, the control circuitry 106 is configured to generate the augmented color image, such as by using the plurality of image-level augmentation operations and the dataset-level augmentation operations. In an implementation, the augmented color images are generated through on-fly augmentation, such as at operation 332. Moreover, the on-fly augmentation refers to a real-time process of applying data augmentation operations on the acquired color input images during the training phase of the CD NN model 108C. Therefore, instead of pre-generating the augmented color images and storing the generated augmented color images, the on-fly augmentation generates the augmented color images of the input data at any moment of time, during the training phase. Finally, at operation 334, the generated augmented color image data set that includes the plurality of generated augmented color images are used to train the CD NN model 108C in order to identify the plurality of different types of soil.

Figure 3C:
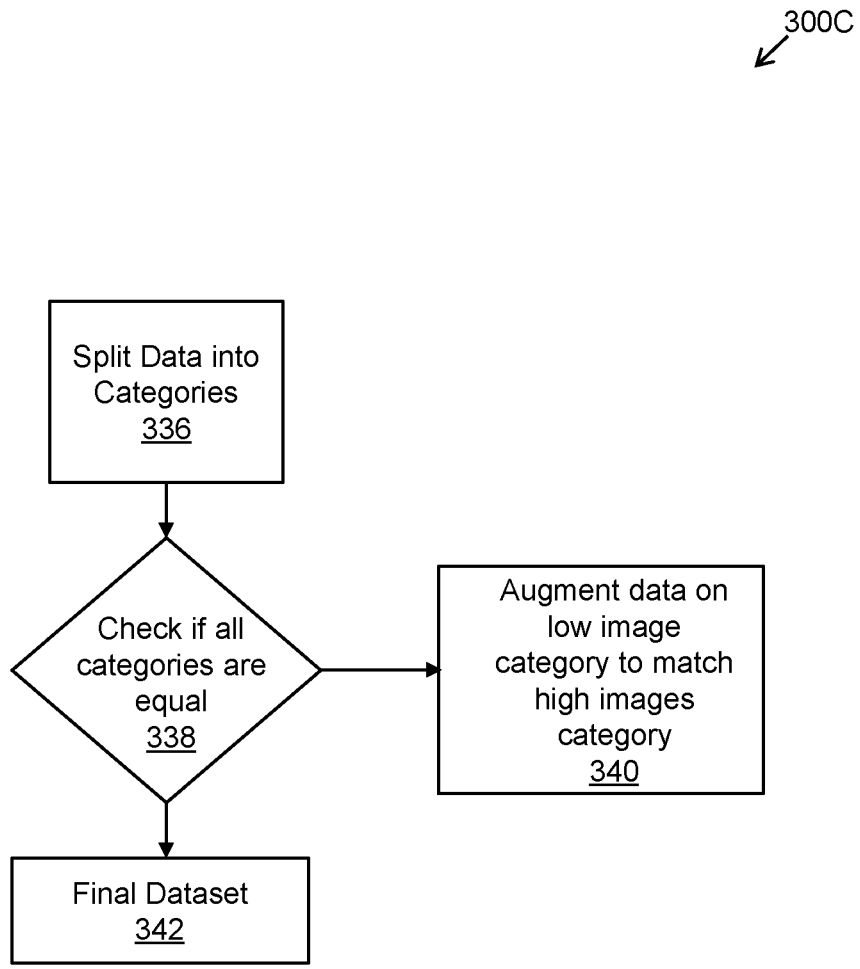
FIG. 3C is a diagram that depicts a flowchart for data balancing, in accordance with an embodiment of the present disclosure.

FIG. 3C is a diagram that depicts a flowchart for data balancing, in accordance with an embodiment of the present disclosure. FIG. 3C is described in conjunction with elements from FIGS. 1A-1C, 2A-2D, and 3A-3B. With reference to FIG. 3C, there is shown a flow chart 300C for data balancing. As shown in FIG. 3C, the flow chart 300C includes a series of operations 336 to 342.

At operation 336, the data is split into different categories, such as the age group (e.g., 10 days, 20 days, 30 days, and the like) of the crop plant, the time of capture (e.g., 8 AM to 10 AM, 10 AM to 12 PM, 12 PM to 2 PM, 2 PM to 4 PM, 4 PM to 6 PM, 6 PM to 8 PM, and the like), the lighting (e.g., bright light during sunny day, dull light during cloudy, the artificial light (during night time), and the like), the weed density (e.g., no weed, low weed, medium weed, and high weed), the soil conditions (e.g., wet soil, dry soil, cracked soil, and the like), the disease severity (e.g., highly affected crop plant, medium effected and low or not affected crop plants). In addition, the different categories may also include the region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like).

At operation 338, the control circuitry 106 is configured to check if all the categories are equal or not. Moreover, if all the categories are equal, then, in that case, the operation 342 is executed and if all the categories are not equal, then, in that case, the operation 340 is executed. At operation 340, the control circuitry 106 is configured to augment the data on the low image category to match the high image category. Finally, at operation 342, a final dataset is generated that is further utilized to train the CD NN model 108C.

Figure 3D:
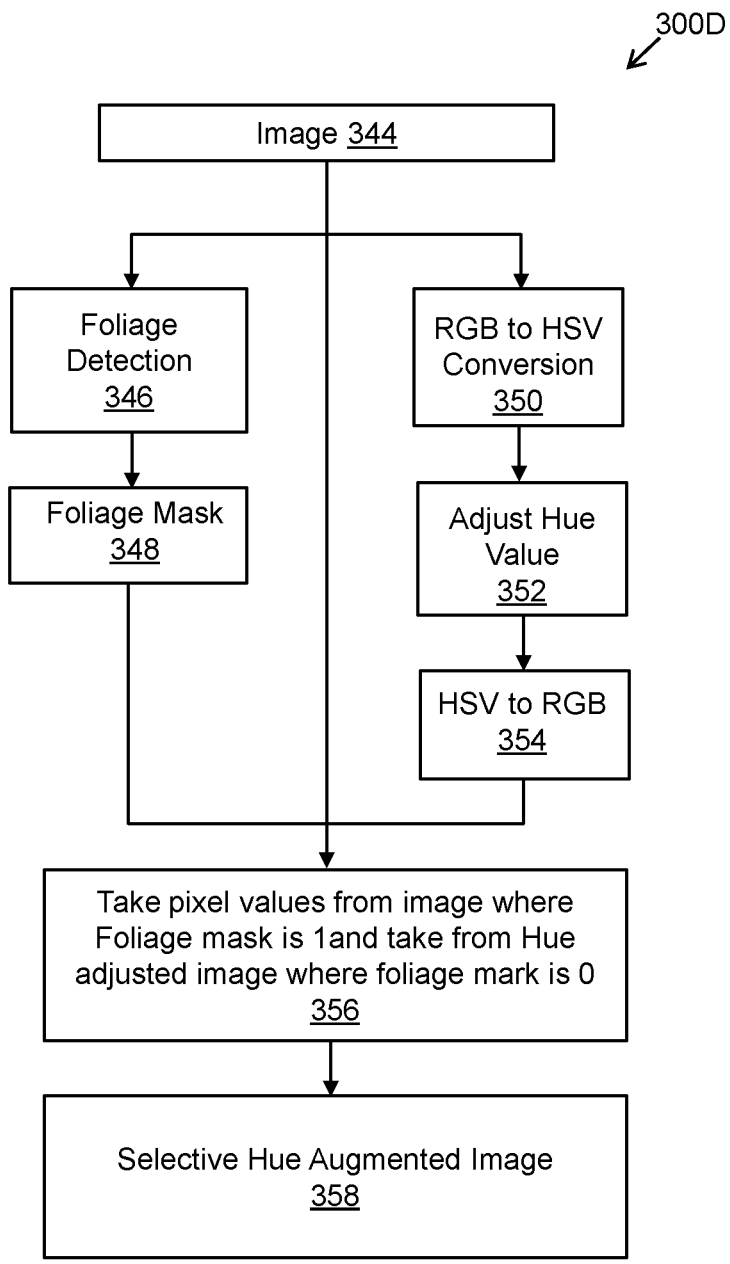
FIG. 3D is a diagram that depicts a flowchart for selectively adjusting a hue component of a HSV image, in accordance with an embodiment of the present disclosure.

FIG. 3D is a diagram that depicts a flowchart for selectively adjusting a hue component of a HSV image, in accordance with an embodiment of the present disclosure. FIG. 3D is described in conjunction with elements from FIGS. 1A-1C, 2A-2D, and 3A-3C. With reference to FIG. 3D, there is shown a flow chart 300D for selectively adjusting a hue component of the HSV image. As shown in FIG. 3D, the flow chart 300D includes a series of operations 344 to 358.

At operation 344, an input color image of a field of view (FOV) of an agricultural field is acquired. After that, at operation 346, the control circuitry 106 is configured to detect one or more foliage regions in the input color image and generate an output binary mask image of foliage mask indicating the one or more foliage regions and a soil region, such as at operation 348. Furthermore, at operation 350, the control circuitry 106 is configured to convert the input color image from the RGB color space to a Hue, Saturation, Lightness (HSV) color space to obtain an HSV image. After that, at operation 352, the control circuitry 106 is configured to selectively adjust a hue component of the HSV image corresponding to the soil region indicated by the output binary mask image of the foliage mask. At operation 354, the control circuitry 106 is configured to convert the selectively adjusted HSV image back to the RGB color space to obtain a soil region-adjusted RGB image. Furthermore, the control circuitry 106 is configured to generate an augmented color image by combining pixels of the soil region from the soil region adjusted RGB image, with pixels of the one or more foliage regions unaltered from the acquired input color image in the RGB color space, such as at operation 356 and at operation 358. Finally, the control circuitry 106 is configured to utilize the generated augmented color image in training of a crop detection (CD) neural network model 108C to cause the CD neural network model 108C to learn a plurality of different types of soil and a range of color variation of soil.

The CD NN model 108C is trained to obtain a trained CD NN model 108D. The training of the CD NN model 108C is described in detail, for example, in FIGS. 1B and 1C. The trained CD NN model 108D enables the image sensor 110 to process high-quality input color images of the agricultural field despite of variations in the environmental parameters (i.e., variation in sunlight due to either clouds or rain or shadow of a large object). Moreover, the trained CD NN model 108D enables the camera apparatus 102 to clearly identify the plurality of different types of soils (e.g., dry soil, wet soil, cracked soil, and the like) with advanced features and results in performing controlled and perceptive operations, such as detecting the soil conditions and the like. Alternatively stated, the trained CD NN model 108D enhances the accuracy and efficiency of the camera apparatus 102. In an implementation, the trained CD NN model 108D may be stored in the memory 202 (of FIG. 2). In another implementation, the trained CD NN model 108C may be disposed outside the memory 202 (of FIG. 2) as a sperate module or circuitry and communicatively coupled to the memory 202.

In accordance with an embodiment, there is a training phase for the CD NN model 108C to obtain the trained CD NN model 108C used in an operational phase of the camera apparatus 102. The training phase of the CD NN model 108C is described in detail, in FIG. 1A and FIG. 1C.

Training Phase of the CD NN Model 108C

Figure 3E:
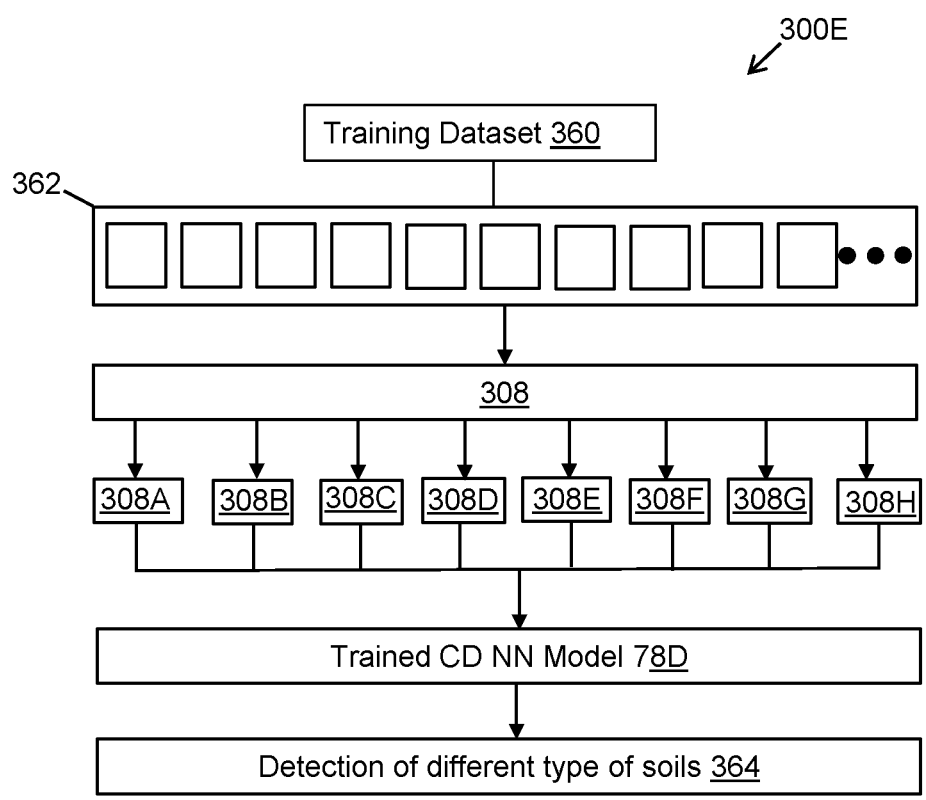
FIG. 3E is a diagram that depicts an exemplary scenario of training the CD NN model to obtain a trained crop detection (CD) neural network (NN) model, in accordance with an embodiment of the present disclosure.

Now referring to FIG. 3E, there is shown an exemplary scenario 300E of training of CD NN model 108C to obtain a trained CD NN model 108D, in accordance with an embodiment of the present disclosure. In the training phase, the control circuitry 106 is configured to obtain a training dataset 360 (i.e., training dataset of the input color images of the FOV of the agricultural field) from the image sensor 104. The training dataset 360 used in the training phase may include thousands of different images of the agricultural field plant (e.g., images of the one or more foliage regions and the soil region) that are captured with a holistic view of the one or more foliage regions and the soil regions. In an implementation, the training dataset 360 includes input colour images of the plants (indicating the one or more foliage regions and the soil region) captured in actual real-world conditions on the agricultural field. Furthermore, the training dataset further includes images that are captured at different times of day (e.g., early morning, evening, or night), and at different growth stages (e.g., two-day cotton plant, three-day cotton plant), different heath states (e.g., diseased and non-diseased, etc.), and under different surrounding environmental conditions, with variation in sunlight due to either clouds, rain, a shadow of a large object, like tree, while capturing an image, change in position of sun throughout the day, different light intensity when farming is done etc.), such as the input color images 362 that include different variations, such as the age group (e.g., 10 days, 20 days, 30 days, and the like) of the crop plant, the time of capture (e.g., 8 AM to 10 AM, 10 AM to 12 PM, 12 PM to 2 PM, 2 PM to 4 PM, 4 PM to 6 PM, 6 PM to 8 PM, and the like), the lighting (e.g., bright light during sunny day, dull light during cloudy, the artificial light (during night time), and the like), the weed density (e.g., no weed, low weed, medium weed, and high weed), the soil conditions (e.g., wet soil, dry soil, cracked soil, and the like), the disease severity (e.g., highly affected crop plant, medium effected and low or not affected crop plants). In addition, the different categories may also include the region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like). Furthermore, the plurality of image-level augmentation operations, such as at operation 308 are applied to the acquired input color images 362.

At operation 308A, the control circuitry 106 is configured to perform mosaicking image-level augmentation operation. Moreover, mosaicking image-level augmentation operation includes the combination of spatial positions of the captured FOV of the agricultural field. Moreover, multiple images are stacked together horizontally and vertically in order to further crop the corresponding captured color images at different spatial locations.

At operation 308B, the control circuitry 106 is configured to perform masking image-level augmentation operation, such as to reduce false positives and increase the accuracy and reliability of the trained CD NN model 108C. The captured colour images are cropped to get the cropped images that include different sub-parts of the acquired input images. However, some cropped images are partially visible, and a bounding box is created around the plant, then, in that case, it does not contain a significant part of the plant. Therefore, there can be a situation in which the CD NN model 108C may give false positives due to inaccurate training due to cropping of the images. Moreover, the CD NN model 108C may learn patterns that are not related to the plant of interest and train the CD NN model 108C to predict false positives (i.e., the plants that are not the actual plant of interest). Therefore, in order to address the above-mentioned problem, the control circuitry 106 is configured to mask the corresponding bounding boxes with black pixels (having binary value as "0"). As a result, the false positives can be reduced. Furthermore, no feature masking can also be performed in order to reduce confusion to the CD NN model 108C.

At operation 308C, the control circuitry 106 is configured to perform the scaling image level augmentation operation. Moreover, the scaling image level augmentation operation includes zoom in and zoom out of the acquired input color image. However, the control circuitry 106 is configured to add padding to match the required image dimension while zooming out the acquired input color image. As a result, the scaling image level augmentation operation is used to handle different FOVs of the agricultural field.

At operation 308D, the control circuitry 106 is configured to perform selective HSV image level augmentation operation. Moreover, the HSV states hue, saturation, and lightness in the acquired color images. The selective HSV image level augmentation operation can be used to generate an augmented color image that can be further utilized to train the CD NN model 108C for the identification of the different types of soil. The hue component is modified when applied to the entire acquired input color image to learn different types and colors of soil (i.e., color variation of brown color). In an implementation, the control circuitry 106 is configured to consider an image and run foliage detection, which gives an output foliage mask with pixels where foliage is presented as 1 and the soil region is presented as 0. Thereafter, the control circuitry 106 is configured to apply HSV augmentation only to the soil region of the image and not to the one or more foliage regions, such as by inverting the binary values of the one or more foliage with the binary value of the soil regions.

At operation 308E, the control circuitry 106 is configured to perform rotation image level augmentation operation. In an implementation, the rotation image level augmentation operation includes rotation of the acquired input image at different angles chosen randomly, such as from 0 degrees to 360 degrees in order to allow the CD NN model 108C to detect the different types of soils even in the color images having rotation invariant.

At operation 308F, the control circuitry 106 is configured to perform shadow image level augmentation operation. In such an operation, the control circuitry 106 is configured to address the presence of shadows caused by various objects (e.g., boom, spraying nozzle, and the like) and sudden changes in illumination that create contrasting regions in the corresponding image. Such image-level augmentation operation introduces shadows randomly across different areas of the image to mitigate the impact of sharp edges and corners thereby ensuring a robust training by simulating diverse lighting conditions and reducing sensitivity to specific image characteristics.

At operation 308G, the control circuitry 106 is configured to perform translation image level augmentation operation. In such an operation, the control circuitry 106 is configured to move the image in an x and y direction by randomly choosing values from 10 pxls to 100 pxls to ensure that the detection by the CD NN model 108C can work for one or more foliage and soil regions at any spatial location in the acquired input color image.

At operation 308H, the control circuitry 106 is configured to perform a flipping image level augmentation operation. In such an operation, the control circuitry 106 is configured to flip the image vertically and horizontally 50% of the time. However, 50% of the acquired input color images are not flipped and 50% are flipped either horizontally or vertically in order to allow multiple variations that are required for the training of the CD NN model 108C. In addition, the CD NN model 108C can also be trained by using the color images that desperately include the false negatives in order to allow the CD NN model 108C to differentiate between false negatives and true negatives thereby, increasing the accuracy of the CD NN model 108C as compared with the conventional crop detection AI models. Finally, the CD NN model 108C is trained to obtain the trained CD NN model 108D that can be further utilized to detect the plurality of different types of soil (i.e., at operation 364) accurately and reliably.

Figure 4:
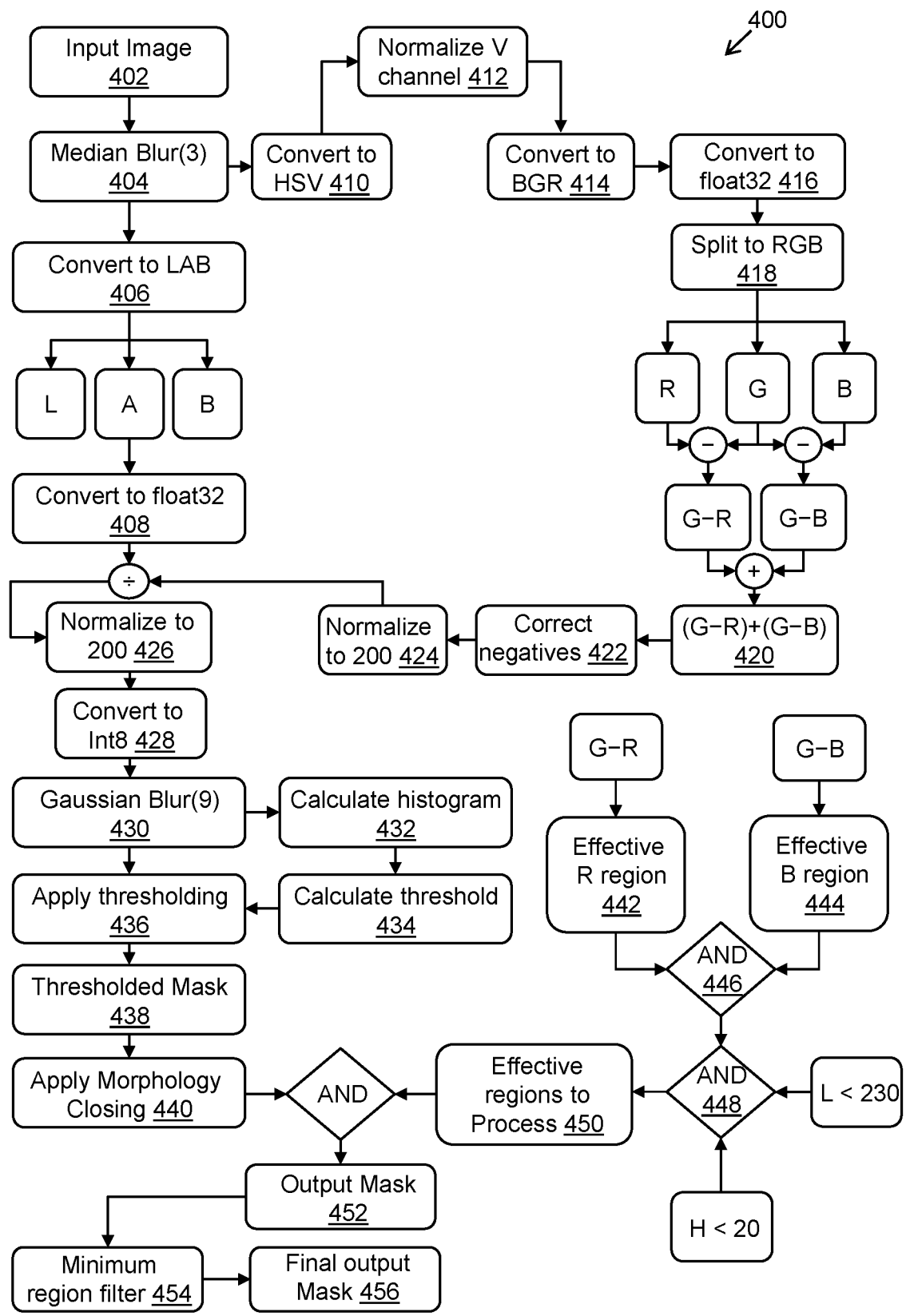
FIG. 4 is a diagram illustrating a flowchart of generating an output binary image of foliage mask, in accordance with an embodiment of the present disclosure.

FIG. 4 is a diagram illustrating a flowchart of generating an output binary image of foliage mask, in accordance with an embodiment of the present disclosure. FIG. 4 is described in conjunction with elements from FIGS. 1A-1C, 2A-2D, and 3A-3E. With reference to FIG. 4, there is shown a flowchart 400 that includes a series of operations 402 to 456. The flowchart 400 is used in training of the FD NN model 108A and executed by the control circuitry 106 of the camera apparatus 102.

At operation 402, an input color image comprising one or more foliage regions is acquired in the FOV of the agricultural field.

At operation 404, the input color image is smoothened by use of the median blur, and a smoothened input color image is generated. The smoothened input color image has even brightness and is converted to a plurality of different color spaces.

At operation 406, the smoothened input color image is subjected to a first color space of the plurality of different color spaces. The first color space is a LAB color space. Each component (i.e., L, A, and B) of the LAB color space is segregated for processing the smoothened input color image. The L-component represents lightness on a scale from 0 (i.e., black) to 100 (i.e., white). The A-component represents a green-red opponent channel, where positive values indicate redness and negative values indicate greenness. The B-component represents a blue-yellow opponent channel, where positive values indicate yellowness and negative values indicate blueness.

At operation 408, after processing through the LAB color space, the image values of the smoothened input color image are converted to floating point values (e.g., float32).

At operation 410, the smoothened input color image is represented in a different form by the use of an HSV channel where HSV stands for hue, saturation, and value, respectively. Alternatively stated, the HSV channel corresponds to a different representation of the smoothened input color image. In the HSV channel, H (hue) represents which colors are present in the smoothened input color image. The value of H is different for different colors, for example, for green color, H will have a certain value, for red color, H will have another value, and the like. S (saturation) represents the amount of colors present in the smoothened input color image and V (value) is for brightness. For a given pixel, how bright is that pixel represented by V. The brighter regions of the smoothened input color image have larger values of V and darker regions have lower values of V.

At operation 412, normalization of the smoothened input color image is performed in the V channel.

At operation 414, after normalization, the smoothened input color image is converted to a BGR (Blue-Green-Red) color space.

At operation 416, the image values of the smoothened input color image are converted to floating point values (i.e., float32).

At operation 418, the smoothened input color image is subjected to a second color space of the plurality of different color spaces. The second color space is an RGB color space. Each component (i.e., R, G, and B) of the RGB color space is segregated for the smoothened input color image. Thereafter, a first difference between a green channel intensity and a red channel intensity (i.e., G−R) and a second difference between the green channel intensity and a blue channel intensity (i.e., G−B) is computed, for the segregated components of the RGB color space. Thereafter, the first difference and the second difference are summed up to obtain a summed output (i.e., (G−R)+(G−B)).

At operation 420, the summed output is generated and used for the execution of a number of channel operations in a second color space processing path associated with the second color space (i.e., RGB color space). By combining the two differences, the summed output (i.e., (G−R)+(G−B)) creates a more robust indicator of foliage presence (i.e., an enhanced foliage signal), even in challenging lighting conditions or with variations in foliage green colors. Furthermore, the summed output condenses foliage-related information into a single value (representing the overall strength of green relative to red and blue), simplifying subsequent processing steps and reducing computational overhead.

At operation 422, negative values are corrected to ensure they fall within the valid range of the RGB color space. This correction is useful for accurate and realistic color representation in the final image output. The correction might involve setting all negative values to zero (as RGB values are typically in the range of 0 to 255) or adjusting them based on a specific algorithmic rule. For example, pixels with negative summed output may be efficiently eliminated from the summed output as they are unlikely to represent foliage. This operation may be also referred to as negative values correction or simply negative correction. The negative values are observed to be associated with noise or non-foliage elements, so removing them improves detection accuracy. For example, consider a pixel with (G−R)=40 and (G−B)=30. The output would be 70, strongly suggesting foliage. Further, a pixel with (G−R)=−10 and (G−B)=5 would have a summed output of −5, indicating a low probability of foliage and potential exclusion.

At operation 424, the image values are normalized to 200. Each pixel value in the image is adjusted to fall within a range of 0 to 200. This ensures consistency and comparability across different colors, and images and restricts the pixels from being saturated. Thereafter, the image values (i.e., the floating-point values) of the smoothened input color image obtained from the first color space (i.e., LAB color space) are divided by the image values (which are normalized to 200) of the smoothened input color image obtained from the second color space (i.e., RGB color space).

At operation 426, the image values of a divided image are normalized to 200. The image output from operation 408 and operation 424 is divided and the divided image is normalized in this operation.

At operation 428, the image values of the smoothened input color image (from the operation 426) are converted to an integer format (e.g., int8 format).

At operation 430, the smoothened input color image is blurred by the use of a Gaussian function (may also be referred to as a Gaussian blur). The Gaussian blur is used to reduce noise from the smoothened input color image. After applying the Gaussian blur, a normalized image is generated.

At operation 432, a histogram of the normalized image is computed.

At operation 434, a threshold value is determined based on the histogram of the normalized image.

At operation 436, the determined threshold value is applied to the normalized image.

At operation 438, after applying the determined threshold value, a first binary mask image (i.e., a threshold mask) is generated.

At operation 440, one or more morphology operations are applied on the first binary mask image (i.e., the threshold mask).

At operation 442, the first effective region is determined using the first difference between the green channel intensity and the red channel intensity. The first effective region is indicative of areas in the smoothened input color image where the red color is more prominent compared to the rest of the smoothened input color image.

At operation 444, a second effective region is determined using the second difference between the green channel intensity and the blue channel intensity. The second effective region is indicative of areas in the smoothened input color image where the blue color is more prominent compared to the rest of the smoothened input color image.

At operation 446, the first effective region and the second effective region are combined together.

At operation 448, the combination of the first effective region, the second effective region, and the L-component (e.g., L<230) representing the lightness of the LAB color space in the identification of the one or more image regions that meet the defined criteria to be considered as the foliage, is utilized. Furthermore, a hue component (e.g., H<20) of the HSV channel is also used along with the combination of the first effective region, the second effective region, and the L-component.

At operation 450, effective regions are processed. The effective regions correspond to all the regions that contain foliage with a slight color tolerance. The foliage regions chosen would be between yellowish green to bluish green rather than stricter green regions. The chosen foliage regions do not have black and saturated regions. Moreover, the size of the foliage regions is based on the presence of foliage in the image. The color variation range can be from RGB (G+20, G, G+20) to RGB (<G, G, <G).

At operation 452, an output binary mask image is generated based on the applied one or more morphology operations and the identified image regions that meet a defined criteria to be considered as foliage (i.e., the foliage regions processed at the operation 450).

At operation 454, a filter is applied to the output binary mask image to remove isolated regions and noise, and an optimized binary image of the foliage mask is generated at operation 456.

Figure 5:
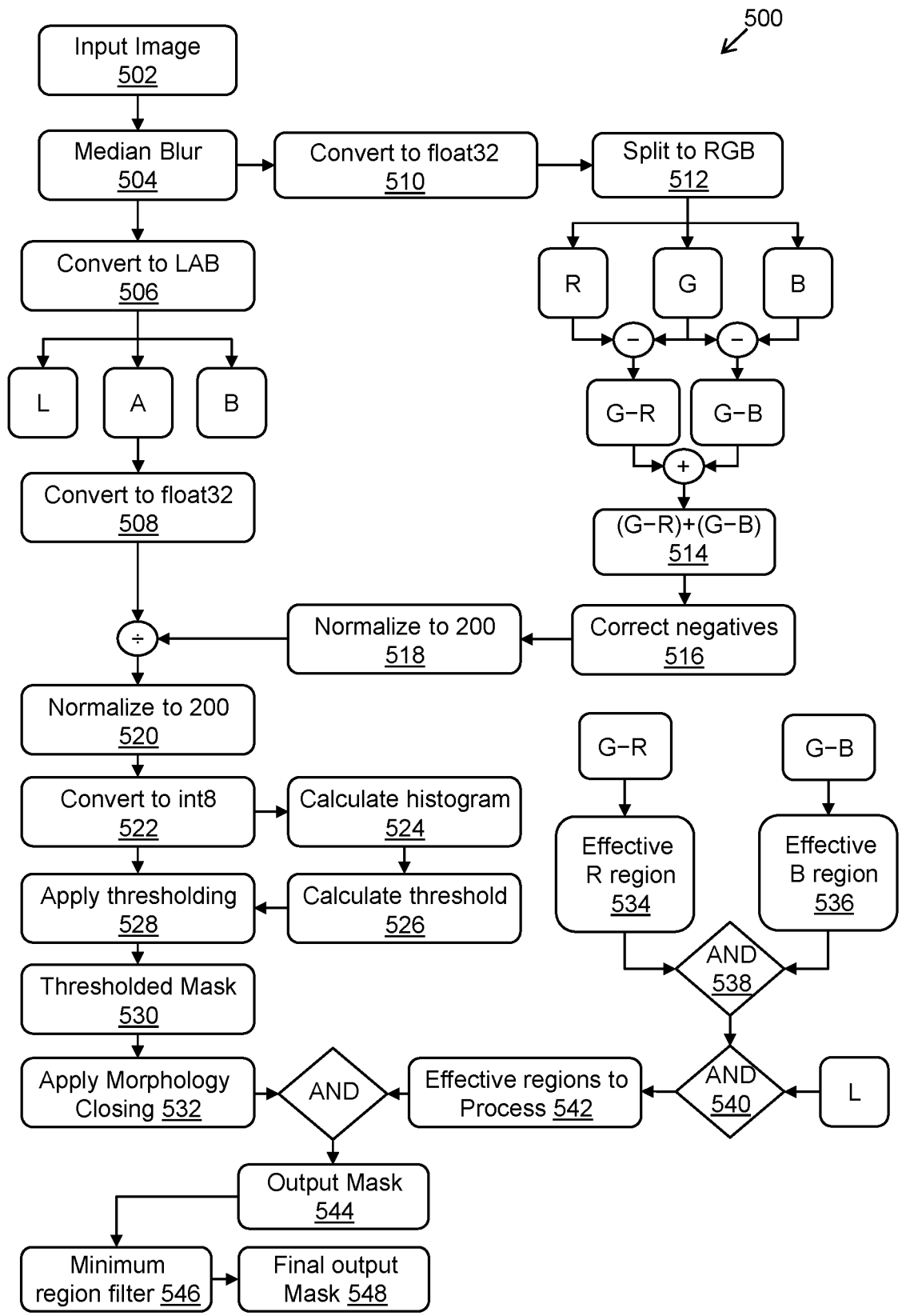
FIG. 5 is a diagram illustrating a flowchart of generating an output binary image of foliage mask, in accordance with another embodiment of the present disclosure.

FIG. 5 is a diagram illustrating a flowchart of generating an output binary image of foliage mask, in accordance with another embodiment of the present disclosure. FIG. 5 is described in conjunction with elements from FIGS. 1A-1C, 2A-2D, 3A-3E, and 4. With reference to FIG. 5, there is shown a flowchart 500 that includes a series of operations 502 to 548. The flowchart 500 is used in training of the foliage detection (FD) NN model 108A and executed by the control circuitry 106 of the camera apparatus 102.

At operation 502, an input color image comprising one or more foliage regions is acquired in the FOV of the agricultural field.

At operation 504, the input color image is smoothened by use of the median blur, and a smoothened input color image is generated. The smoothened input color image has even brightness and is subjected to a plurality of different color spaces.

At operation 506, the smoothened input color image is subjected to a first color space of the plurality of different color spaces. The first color space is a LAB color space. Each component (i.e., L, A, and B) of the LAB color space is segregated for processing the smoothened input color image. The L-component represents lightness on a scale from 0 (i.e., black) to 100 (i.e., white). The A-component represents a green-red opponent channel, where positive values indicate redness and negative values indicate greenness. The B-component represents a blue-yellow opponent channel, where positive values indicate yellowness and negative values indicate blueness.

At operation 508, after processing through the LAB color space, the image values of the smoothened input color image are converted to floating point values (e.g., float32).

At operation 510, the image values of the smoothened input color image are converted to floating point values (i.e., float32).

At operation 512, the smoothened input color image is subjected to a second color space of the plurality of different color spaces. The second color space is an RGB color space.

Each component (i.e., R, G, and B) of the RGB color space is segregated for the smoothened input color image. Thereafter, a first difference between a green channel intensity and a red channel intensity (i.e., G–R) and a second difference between the green channel intensity and a blue channel intensity (i.e., G–B) is computed, for the segregated components of the RGB color space. Thereafter, the first difference and the second difference are summed up to obtain a summed output (i.e., (G–R)+(G–B)).

At operation 514, the summed output is used for the execution of a number of channel operations in a second color space processing path associated with the second color space (i.e., RGB color space).

At operation 516, negative values are corrected to ensure they fall within the valid range of the RGB color space. This correction is useful for accurate and realistic color representation in the final image output. The correction might involve setting all negative values to zero (as RGB values are typically in the range of 0 to 255) or adjusting them based on a specific algorithmic rule.

At operation 518, the image values are normalized to 200. Each pixel value in the image is adjusted to fall within a range of 0 to 200. This ensures consistency and comparability across different colors and images. Thereafter, the image values (i.e., the floating-point values) of the smoothened input color image obtained from the first color space (i.e., LAB color space) are divided by the image values (which are normalized to 200) of the smoothened input color image obtained from the second color space (i.e., RGB color space).

At operation 520, the image values of the smoothened input color image are normalized to 200.

At operation 522, the image values of the smoothened input color image are converted to an integer format (e.g., int8 format).

At operation 524, a histogram of the smoothened input color image (by considering that the image values are converted to the integer format) is computed.

At operation 526, a threshold value is determined based on the computed histogram. The details of determining the threshold value are further explained in detail, for example, in FIG. 9.

At operation 528, the determined threshold value is applied to the smoothened input color image.

At operation 530, after applying the determined threshold value, a first binary mask image (i.e., a threshold mask) is generated.

At operation 532, one or more morphology operations are applied on the first binary mask image (i.e., the threshold mask).

At operation 534, the first effective region is determined using the first difference between the green channel intensity and the red channel intensity. The first effective region is indicative of areas in the smoothened input color image where the red color is more prominent compared to the rest of the smoothened input color image.

At operation 536, a second effective region is determined using the second difference between the green channel intensity and the blue channel intensity. The second effective region is indicative of areas in the smoothened input color image where the blue color is more prominent compared to the rest of the smoothened input color image.

At operation 538, the first effective region and the second effective region are combined together.

At operation 540, the combination of the first effective region, the second effective region, and the L-component representing the lightness of the LAB color space in the identification of the one or more image regions that meet the defined criteria to be considered as the foliage, is utilized.

At operation 542, effective regions are processed. The effective regions correspond to all the regions that contain foliage with a slight color tolerance. The foliage regions chosen would be between yellowish green to bluish green rather than stricter green regions. The chosen foliage regions do not have black and saturated regions. Moreover, the size of the foliage regions is based on the presence of foliage in the image. The color variation range can be from RGB (G+red tolerance, G, G+blue tolerance) to RGB (<G, G, <G).

At operation 544, an output binary mask image is generated based on the applied one or more morphology operations and the identified image regions that meet a defined criteria to be considered as foliage (i.e., the foliage regions processed at the operation 650).

At operation 546, a filter is applied to the output binary mask image to remove isolated regions and noise, and an optimized binary image of the foliage mask is generated at operation 548.

Figure 6:
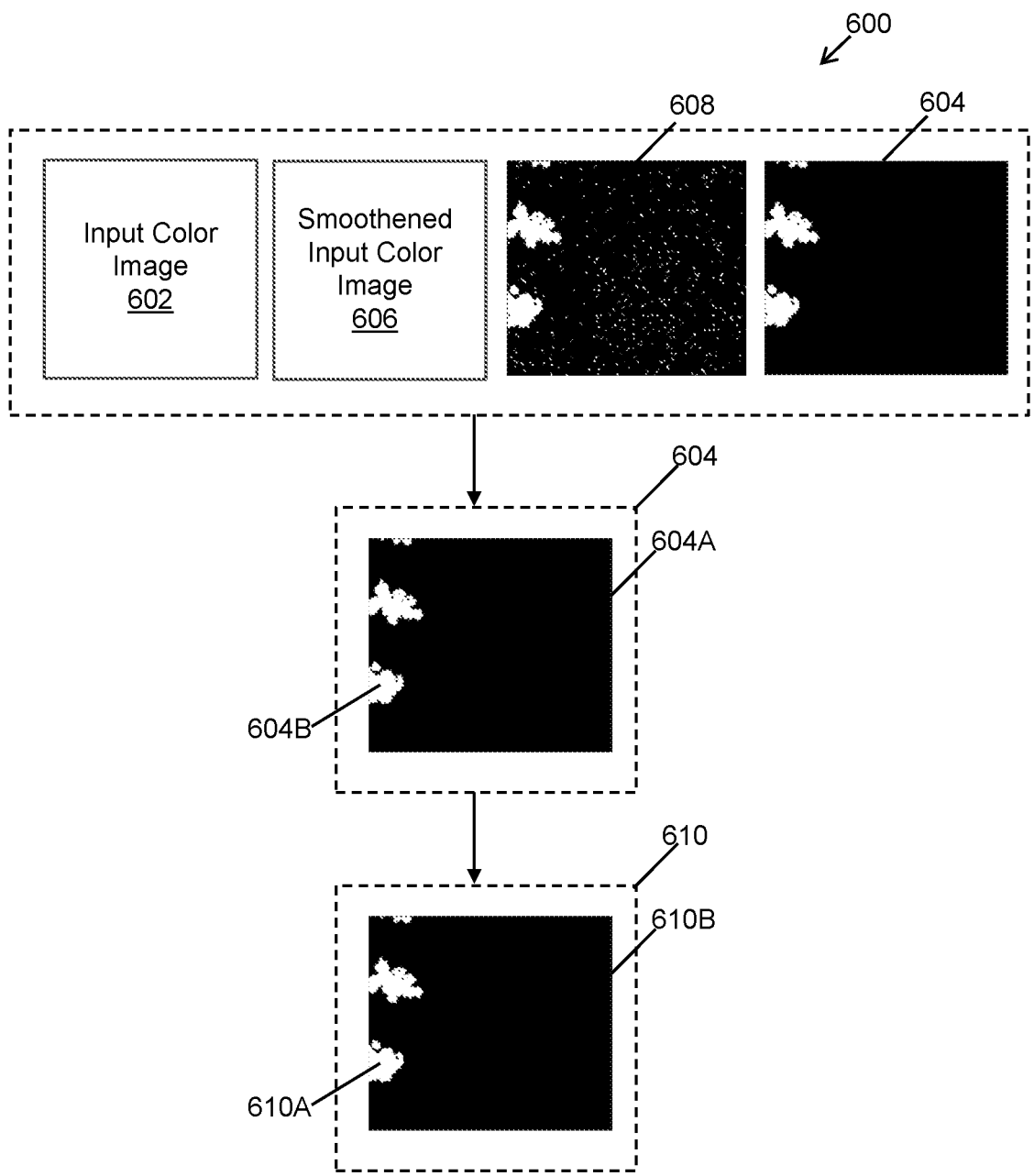
FIG. 6 is a diagram illustrating an exemplary scenario of the generation of an output binary mask image from an input color image, in accordance with an embodiment of the present disclosure.

FIG. 6 is a diagram illustrating an exemplary scenario of the generation of an output binary mask image from an input color image, in accordance with an embodiment of the present disclosure. FIG. 6 is described in conjunction with elements from FIGS. 1A-1C, 2A-2D, 3A-3E, 4, and 5. With reference to FIG. 6, there is shown an exemplary scenario 600 that illustrates the generation of an output binary mask image 604 from an input color image 602.

The input color image 602 is an RGB color image captured in the FOV of the agricultural field. The input color image 602 comprises one or more foliage regions and one or more non-foliage regions. The input color image 602 is smoothened by use of median blur and a smoothened input color image 606 is generated. The smoothened input color image 602 is converted into a plurality of different color spaces, such as an RGB color space. Furthermore, a set of channel operations on an individual channel or combined channels are executed, in each color space of the plurality of different color spaces, to enhance green pixels and suppress other pixels. The green pixels are indicative of the one or more foliage regions. Thereafter, a threshold value is applied on the smoothened input color image 606 to obtain a first binary mask image 608 followed by applying one or more morphology operations on the first binary mask image 608 to remove noise present in the first binary mask image 608. Finally, the output binary mask image 604 is generated, which is a black and white image, where white regions 604A represent the one or more foliage regions and black regions 604B represents the soil (one or more non-foliage) regions.

Furthermore, the control circuitry 106 is configured to invert the output binary mask image 604 of the foliage mask to obtain an inverted output binary mask image 610 of the foliage mask in which the first set of pixels with the binary value "1" corresponding to the one or more foliage regions is re-assigned the binary value "0" and the second set of pixels with binary value "0" corresponding to the soil region is re-assigned the binary value "1" to allow processing of the second set of pixels for the selective adjustment of the hue component of the HSV image. For example, the white region 610A (having binary value 1) represents the soil region and the black region 610B (having binary value 0) represents the one or more foliage regions. The inversion of the binary values, for example, re-assigning the first set of pixels with the binary value "0" and the binary value "1" to the second set of pixels is used to allow the further processing (e.g., facilitating subsequent selective hue adjustments in the HSV image) of the second set of pixels that are indicative of the soil region without affecting the one or more foliage regions. Therefore, the obtained inverted output binary mask image of the foliage mask is used to enhance the accuracy and adaptability of the CD NN model 108C in recognizing and distinguishing between different components (i.e., the one or more foliage regions and the different types of soils) in the agricultural field.

Figure 7A:
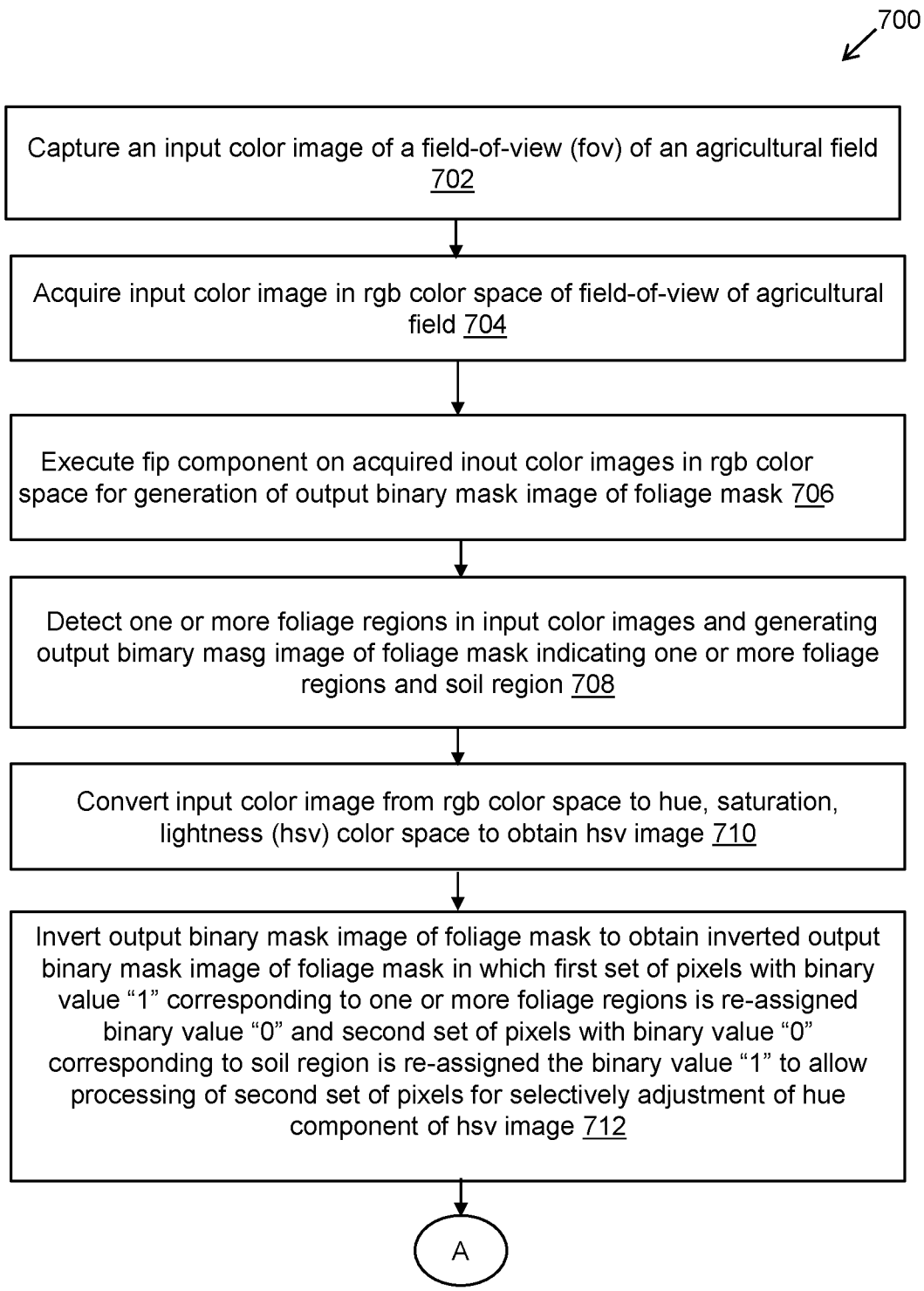
FIGS. 7A and 7B collectively is a diagram illustrating a flowchart of a method of training and operating a neural network model for crop detection, in accordance with an embodiment of the present disclosure.
Figure 7B:
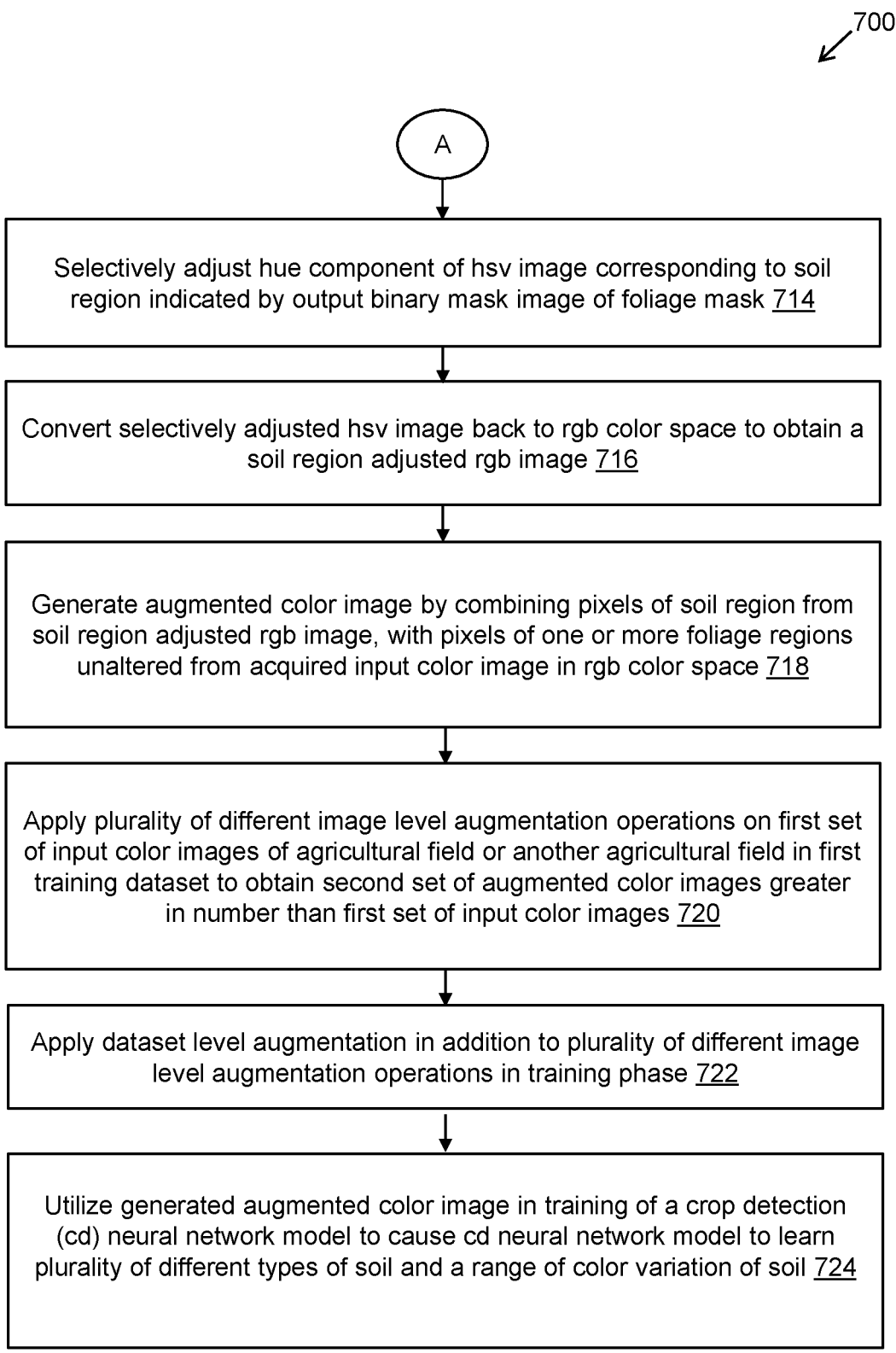

FIGS. 7A, and 7B is a diagram illustrating a flowchart of a method of training and operating a neural network model for crop detection, in accordance with an embodiment of the present disclosure. FIGS. 7A and 7B are described in conjunction with elements from FIGS. 1A-1C, 2A-2D, 3A-3E, 4, 5, and 6. With reference to FIGS. 7A and 7B, there is shown a method 700 that includes operations 702 to 724. In an implementation, the camera apparatus 102 (of FIG. 1A) may be configured to execute the method 700. In another implementation, the training server 116 (of FIG. 1C) may be configured to execute the method 700 (except the operation 702, captured by the image sensor 110).

At 702, an input color image of a field-of-view (FOV) of an agricultural field may be captured. The image sensor 110 is configured to capture the input color image. Moreover, the FOV of the input color image may range from 1.75 to 2.25 meters, or 2 meters of the agricultural field.

At 704, the input color image in a Red, Green, Blue (RGB) color space of a field-of-view (FOV) of an agricultural field, may be acquired. The control circuitry 106 is configured to acquire the input color image in a Red, Green, Blue (RGB) color space of the FOV of the agricultural field, from the image sensor 110.

At 706, an FIP component 120 may be executed on the acquired input color image in the RGB color space for the generation of the output binary mask image of foliage mask.

At 708, one or more foliage regions may be detected in the input color image and generate an output binary mask image of foliage mask indicating the one or more foliage regions and a soil region. In accordance with an embodiment, the output binary mask image of foliage mask includes a first set of pixels with binary value "1" corresponding to the one or more foliage regions and a second set of pixels with binary value "0" corresponding to the soil region.

At 710, the input color image may be converted from the RGB color space to a Hue, Saturation, Lightness (HSV) color space to obtain an HSV image.

At 712, the output binary mask image of foliage mask may be inverted to obtain an inverted output binary mask image of foliage mask in which the first set of pixels with the binary value "1" corresponding to the one or more foliage regions is re-assigned the binary value "0" and the second set of pixels with binary value "0" corresponding to the soil region is re-assigned the binary value "1" to allow processing of the second set of pixels for the selectively adjustment of the hue component of the HSV image.

At 714, a hue component of the HSV image corresponding to the soil region indicated by the output binary mask image of the foliage mask, may be selectively adjusted.

At 716, the selectively adjusted HSV image may be converted back to the RGB color space to obtain a soil region adjusted RGB image.

At 718, an augmented color image may be generated by combining pixels of the soil region from the soil region adjusted RGB image, with pixels of the one or more foliage regions unaltered from the acquired input color image in the RGB color space.

At 720, a plurality of different image-level augmentation operations may be applied on a first set of input color images of the agricultural field or another agricultural field in a first training dataset to obtain a second set of augmented color images greater in number than the first set of input color images, wherein a combination of the second set of augmented color images and the first set of input color images in form of a modified training dataset is further used for the training of the CD neural network model 108C in a training phase.

At 722, a dataset-level augmentation may be applied in addition to the plurality of different image-level augmentation operations in the training phase.

At 724, utilize the generated augmented color image in training of a crop detection (CD) neural network model 108C, for example, to cause the CD neural network model 108C to learn a plurality of different types of soil and a range of color variation of soil. The CD NN model 108C may be caused to further learn a color variation range of a predefined color associated with the plurality of features. The predefined color may be a brown color, and the color variation range of the predefined color corresponds to a plurality of different shades of the brown color. The color variation range of the brown color corresponds to different shades of brown. Examples of the different shades of brown include but are not limited to light brown (570-590 nm), medium brown (530-570 nm), dark brown (490-530 nm), chestnut brown (460-490 nm), chocolate brown (430-460 nm), mahogany brown (400-430 nm), cinnamon brown (390-420 nm), caramel brown (370-400 nm), walnut brown (350-380 nm), and hazel brown (320-350 nm). The CD NN model 108C may be caused to utilize a combination of the plurality of features related to the different types of soil (e.g., cracks, algae, and such appearances on the soil region) and the color variation range of the predefined color to obtain the trained crop detection (CD) neural network (NN) model 108D.

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to a central processing unit ("CPU"), microprocessor, micro controller, digital signal processor, processor core, system on chip ("SOC") or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory any other non-transitory medium including digital, optical, analog-based medium, such as removable storage media). Embodiments of the present disclosure may include methods of providing the apparatus described herein by providing software describing the apparatus and subsequently transmitting the software as a computer data signal over a communication network including the internet and intranets.

It is to be further understood that the system described herein may be included in a semiconductor intellectual property core, such as a microprocessor core (e.g., embodied in HDL) and transformed to hardware in the production of integrated circuits. Additionally, the system described herein may be embodied as a combination of hardware and software. Thus, the present disclosure should not be limited by any of the above-described exemplary embodiments but should be defined only in accordance with the following claims and their equivalents.

What is claimed is:

1. A camera apparatus, comprising:
control circuitry configured to:
acquire an input color image in a Red, Green, Blue (RGB) color space of a field-of-view (FOV) of an agricultural field;
detect one or more foliage regions in the input color image and generate an output binary mask image of foliage mask indicating the one or more foliage regions and a soil region;
convert the input color image from the RGB color space to a Hue, Saturation, Lightness (HSV) color space to obtain an HSV image;
selectively adjust a hue component of the HSV image corresponding to the soil region indicated by the output binary mask image of foliage mask;
convert the selectively adjusted HSV image back to the RGB color space to obtain a soil region-adjusted RGB image;
generate an augmented color image by combining pixels of the soil region from the soil region adjusted RGB image, with pixels of the one or more foliage regions unaltered from the acquired input color image in the RGB color space; and
utilize the generated augmented color image in training of a crop detection (CD) neural network model.

2. The camera apparatus according to claim 1, wherein the control circuitry is further configured to modify a hue value of a first set of pixels of the HSV image corresponding to the soil region indicated by the output binary mask image of foliage mask by adding or subtracting a randomly chosen integer value in the range of 1 to 50 from the hue value of each pixel of the first set of pixels for the selective adjustment of the hue component of the HSV image.

3. The camera apparatus according to claim 1, further comprising an image sensor configured to capture the input color image, wherein the FOV of input color image ranges from 1.75 to 2.25 meters of the agricultural field.

4. The camera apparatus according to claim 1, further comprising a Foliage Detection (FD) neural network model, wherein the control circuitry is configured to execute the FD neural network model on the acquired input color image in the RGB color space for the detection of the one or more foliage regions in the input color image and the generation of the output binary mask image of foliage mask.

5. The camera apparatus according to claim 1, further comprising a Foliage Image Processing (FIP) component, wherein the control circuitry is configured to execute the FIP component on the acquired input color image in the RGB color space for the generation of the output binary mask image of foliage mask.

6. The camera apparatus according to claim 1, wherein the output binary mask image of foliage mask comprises a first set of pixels with binary value "1" corresponding to the one or more foliage regions and a second set of pixels with binary value "0" corresponding to the soil region.

7. The camera apparatus according to claim 6, wherein the control circuitry is further configured to invert the output binary mask image of foliage mask to obtain an inverted output binary mask image of foliage mask in which:

the first set of pixels with the binary value "1" corresponding to the one or more foliage regions is re-assigned the binary value "0"

and the second set of pixels with binary value "0" corresponding to the soil region is re-assigned the binary value "1" to allow processing of the second set of pixels for the selectively adjustment of the hue component of the HSV image.

8. The camera apparatus according to claim 1, wherein control circuitry, in a training phase, is further configured to apply a plurality of different image level augmentation operations on a first set of input color images of the agricultural field or another agricultural field in a first training dataset to obtain a second set of augmented color images greater in number than the first set of input color images, wherein a combination of the second set of augmented color images and the first set of input color images in form of a modified training dataset is further used for the training of the CD neural network model.

9. The camera apparatus according to claim 8, wherein control circuitry, in a training phase, is further configured to apply a dataset level augmentation in addition to the plurality of different image level augmentation operations.

10. The camera apparatus according to claim 1, wherein control circuitry, in a training phase, is further configured to cause the CD neural network model to learn a plurality of different types of soil and a range of color variation of soil.

11. A method of augmenting agricultural image data, the method comprising:

acquiring, by a control circuitry, an input color image in a Red, Green, Blue (RGB) color space of a field-of-view (FOV) of an agricultural field;

detecting, by the control circuitry, one or more foliage regions in the input color image and generate an output binary mask image of foliage mask indicating the one or more foliage regions and a soil region;

converting, by the control circuitry, the input color image from the RGB color space to a Hue, Saturation, Lightness (HSV) color space to obtain an HSV image;

selectively adjusting, by the control circuitry, a hue component of the HSV image corresponding to the soil region indicated by the output binary mask image of foliage mask;

converting, by the control circuitry, the selectively adjusted HSV image back to the RGB color space to obtain a soil region-adjusted RGB image;

generating, by the control circuitry, an augmented color image by combining pixels of the soil region from the soil region adjusted RGB image, with pixels of the one or more foliage regions unaltered from the acquired input color image in the RGB color space; and utilizing, by the control circuitry, the generated augmented color image in training of a crop detection (CD) neural network model.

12. The method according to claim 11, further comprising modifying, by the control circuitry, a hue value of a first set of pixels of the HSV image corresponding to the soil region indicated by the output binary mask image of foliage mask by adding or subtracting a randomly chosen integer value in the range of 1 to 50 from the hue value of each pixel of the first set of pixels for the selective adjustment of the hue component of the HSV image.

13. The method according to claim 11, further comprising executing, by the control circuitry, a Foliage Detection (FD) neural network model on the acquired input color image in the RGB color space for the detection of the one or more foliage regions in the input color image and the generation of the output binary mask image of foliage mask.

14. The method according to claim 11, further comprising capturing, by an image sensor, the input color image, wherein the FOV of input color image ranges from 1.75 to 2.25 meters of the agricultural field.

15. The method according to claim 11, further comprising executing, by the control circuitry, the FIP component on the acquired input color image in the RGB color space for the generation of the output binary mask image of foliage mask.

16. The method according to claim 11, wherein the output binary mask image of foliage mask comprises a first set of pixels with binary value "1" corresponding to the one or more foliage regions and a second set of pixels with binary value "0" corresponding to the soil region.

17. The method according to claim 16, further comprising inverting, by the control circuitry, the output binary mask image of foliage mask for obtaining an inverted output binary mask image of foliage mask in which:

the first set of pixels with the binary value "1" corresponding to the one or more foliage regions is re-assigned the binary value "0"

and the second set of pixels with binary value "0" corresponding to the soil region is re-assigned the binary value "1" to allow processing of the second set of pixels for the selective adjustment of the hue component of the HSV image.

18. The method according to claim 11, further comprising applying, by the control circuitry, a plurality of different image level augmentation operations on a first set of input color images of the agricultural field or another agricultural field in a first training dataset to obtain a second set of augmented color images greater in number than the first set of input color images, wherein a combination of the second set of augmented color images and the first set of input color images in form of a modified training dataset is further used for the training of the CD neural network model in a training phase.

19. The method according to claim 18, further comprising applying, by the control circuitry, a dataset-level augmentation in addition to the plurality of different image-level augmentation operations in the training phase.

20. The method according to claim 11, further comprising causing the CD neural network model in a training phase to learn a plurality of different types of soil and a range of color variation of soil.

* * * * *